US007074542B2

(12) United States Patent
Aoshima

(10) Patent No.: US 7,074,542 B2
(45) Date of Patent: Jul. 11, 2006

(54) PLANOGRAPHIC PRINTING PLATE PRECURSOR

(75) Inventor: Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 89 days.

(21) Appl. No.: 10/087,834

(22) Filed: Mar. 5, 2002

(65) Prior Publication Data

US 2002/0189476 A1 Dec. 19, 2002

(30) Foreign Application Priority Data

Mar. 6, 2001 (JP) ............................ 2001-061475

(51) Int. Cl.
*B41N 1/00* (2006.01)
*B41N 3/00* (2006.01)
*G03F 7/016* (2006.01)
*G03F 7/11* (2006.01)

(52) U.S. Cl. ................ 430/162; 430/273.1; 430/278.1; 101/467; 101/463.1

(58) Field of Classification Search ................ 430/162, 430/273.1; 101/467, 463.1
See application file for complete search history.

(56) References Cited

U.S. PATENT DOCUMENTS

| | | | | |
|---|---|---|---|---|
| 3,729,313 | A * | 4/1973 | Smith | 430/332 |
| 4,058,400 | A * | 11/1977 | Crivello | 522/31 |
| 4,058,401 | A * | 11/1977 | Crivello | 430/280.1 |
| 4,228,232 | A * | 10/1980 | Rousseau | 430/271.1 |
| 4,445,998 | A * | 5/1984 | Kanda et al. | 264/385 |
| 5,340,699 | A | 8/1994 | Haley et al. | |
| 5,506,090 | A * | 4/1996 | Gardner, Jr. et al. | 430/273.1 |
| 6,153,356 | A | 11/2000 | Urano et al. | |
| 6,555,291 | B1 * | 4/2003 | Hauck | 430/273.1 |

FOREIGN PATENT DOCUMENTS

| | | |
|---|---|---|
| WO | WO 97/00777 | 1/1997 |
| WO | WO-02/14071 A1 * | 2/2002 |

* cited by examiner

*Primary Examiner*—Cynthia Hamilton
(74) *Attorney, Agent, or Firm*—Buchanan Ingersoll PC

(57) ABSTRACT

A planographic printing plate precursor comprising: a substrate; a photosensitive layer disposed on the substrate, the photosensitive layer including a light-to-heat conversion agent and a compound, which is at least one of crosslinkable and polymerizable, with solubility of the photosensitive layer in an alkali developing solution being decreased by the effect of at least one of light and heat; and an overcoat layer including a polymer, which is hydrophobic and soluble in an aqueous alkali solution.

39 Claims, No Drawings

PLANOGRAPHIC PRINTING PLATE PRECURSOR

BACKGROUND OF THE INVENTION

1. Field of the Invention

The present invention relates to a planographic printing plate precursor having sensitivity in the infrared wavelength range, and more specifically, to a negative type planographic printing plate precursor which can be used in so-called direct plate making and is capable of directly making a printing plate using an infrared laser based on digital signals outputted from a computer or the like.

2. Description of the Related Art

There have been remarkable developments in lasers in recent years. In particular, solid lasers or semiconductor lasers (hereinafter, sometimes referred to as "infrared lasers") emitting infrared rays having wavelengths of 760 nm to 1200 nm, and having a compact size and high output are now readily available. These infrared lasers are very useful as a recording light source when direct plate making is carried out with digital data outputted from a computer or the like. Therefore, recent years have seen an increasing desire for an image recording material having high sensitivity to the above-described infrared ray recording light sources, namely, an image recording material whose solubility in a developing solution changes significantly upon irradiation with infrared rays.

As an example of the above-mentioned negative type image recording material capable of recording images by the use of the infrared lasers, U.S. Pat. No. 5,340,699 discloses a recording material comprising an infrared ray absorbing agent, an acid generating agent, a resol resin, and a novolak resin. However, the above type of negative type recording material needs to be heat-treated after being exposed with lasers to form images. Therefore, negative type image recording materials, which do not require the heat treatment after exposure, are desired.

Further, in a method in which a high-power density exposure using a high-power laser is employed, the exposure areas are intensively and briefly irradiated so as to accumulate with a large amount of light energy during an exposure time, and the light energy is efficiently converted into a heat energy. Due to the heat derived from the light energy, thermal changes such as a chemical change, a phase change, a formation change, or a structural change are caused, and these changes are used to image record. However, in photosensitive layers of conventional planographic printing plate precursors, if an amount to be added of an infrared ray absorbing agent increased to improve recording sensitivity, laser exposing devices and light sources might be contaminated by materials scattered by ablation of the photosensitive layers.

As an example of a negative type image forming material for accomplishing two objectives of improving an image formability and suppressing the ablation, International Publication (WO) No. 97/00777 discloses a negative type image forming material having a photosensitive layer structured by two layers. In this structure, a surface layer, which is a surface being exposed, has photosensitivity so a problem of ablation being easily generated at the surface layer occurs. Further, a post-exposure is required to obtain a rigid image. In view of the suppression of the ablation, a method, in which an overcoat layer, which comprises a water-soluble polymer and can be removed at the time of development, is provided, may also be employed. The aforementioned overcoat layer can easily be removed together with the photosensitive layer in non-image portions. However, there is a concern that, in a case in which the overcoat layer remains on image portions, a large amount of paper loss caused by insufficient ink application will occur.

The object of the present invention is to provide a negative type planographic printing plate precursor which: can be used for direct plate making by being recorded with digital data from a computer, or the like, using a solid laser or a semiconductor laser emitting infrared rays; has high sensitivity to an infrared laser; suppresses ablation of the photosensitive layer during recording; and in addition, is to suppress paper loss, which is caused by the insufficient ink application during printing.

SUMMARY OF THE INVENTION

The present inventors focused on layer structures and characteristics of surface layers of negative type planographic printing plate precursors which can be used for direct plate making by irradiation thereof with an infrared ray. As a result of intensive research thereof, the present inventors found that the above-described problems can be solved by providing an overcoat layer which does not have sensitivity to an laser exposure, but is hydrophobic and has an excellent solubility in an alkali developing solution, thus completing the present invention.

Namely, the planographic printing plate precursor of the present invention is characterized by disposing, in the following order: a photosensitive layer, comprising a light-to-heat conversion agent and a compound having a crosslinking property or a polymerizing property, a solubility of the photosensitive layer in an alkali developing solution decreases by being affected by light or heat; and an overcoat layer, comprising a polymer, which is hydrophobic and soluble in an aqueous alkali solution; on a substrate.

First aspect of the present invention is a planographic printing plate precursor comprising: a substrate; a photosensitive layer disposed on the substrate, the photosensitive layer including a light-to-heat conversion agent and a compound, which is at least one of crosslinkable and polymerizable, with solubility of the photosensitive layer in an alkali developing solution being decreased by the effect of at least one of light and heat; and an overcoat layer including a polymer, which is hydrophobic and soluble in an aqueous alkali solution.

It should be noted that, in the present invention, a polymer having a hydrophobic property and solubility in an aqueous alkali solution is simply referred to as "an aqueous alkali solution-soluble polymer" with appropriateness. Further, a description of "by being effected by light or heat" implies that of "by being effected by both light and heat".

DESCRIPTION OF THE PREFERRED EMBODIMENTS

Hereinafter, a detailed description of the present invention will be given.

The planographic printing plate precursor of the present invention is characterized by successively providing on a substrate a negative type photosensitive layer and an overcoat layer containing a polymer having a hydrophobic property and solubility in an aqueous alkali solution. It suffices that these layers are provided in that order, and known layers such as an intermediate layer, a backcoat layer or the like, may also be provided insofar as effects of the present invention are not impaired.

First, a description will be made of constituents of the overcoat layer, which is a distinctive structure of the present invention.

[Hydrophobic and Aqueous Alkali Solution-soluble Polymer]

The overcoat layer of the present invention contains a polymer having a hydrophobic property and solubility in an aqueous alkali solution as a primarily component. Since a compound containing this polymer has an excellent coated film formability, the polymer compound can form a layer by itself.

The hydrophobic aqueous alkali solution polymer used in the present invention is not particularly limited, and any of those having an alkali-soluble group in a molecule and the coated film formability can be used.

Further, in the prevent invention, the term "hydrophobic property" refers to a hydrophobicity of 30 degrees or greater, and preferably 50 degrees or greater, when converted into a contact angle with water (an angle of contact with atmospheric water droplets). Therefore, the polymer which forms a coated film with the surface having a value of a contact angle with water of 30 degrees or smaller may cause insufficient ink application when remaining on a surface of a photosensitive layer, which is not preferable as a component of the overcoat layer used in the present invention. Known methods can be applied as a measuring method of the contact angle. For example, a method which measures a contact angle (an angle of contact with atmospheric droplets) using a commercially available device such as CA-Z manufactured by Kyowa Surfactant Science, Ltd., can be applied.

Examples of the alkali-soluble polymer introduced in the aqueous alkali solution-soluble polymer used in the present invention include a carboxylic acid group, group of oxyacid of phosphorus, group of oxyacid of sulfur, imide group, sulfonimide group, sulfonylimide group, phenolic hydroxyl group and the like. In the alkali-soluble polymer, a homopolymer having the above-mentioned acidic group on the main chain and/or side chain in the polymer, a copolymer thereof or mixture thereof is included. Therefore, the overcoat layer relating to the present invention has a characteristic such that it dissolves when it contacts an alkaline developing solution.

Among these alkali-soluble polymers, those containing at least one acidic group selected from the following groups (1) to (6) on the main chain and/or side chain of a polymer are preferable from the standpoint of solubility in an alkaline developing solution.

(1) Phenolic hydroxyl group (—Ar—OH)

(2) Sulfonamide group ($—SO_2NH—R$)

(3) Substituted sulfonamide-based acidic group (hereinafter, referred to as "an active imido group") [$—SO_2NHCOR$, $—SO_2NHSO_2R$, $—CONHSO_2R$]

(4) Carboxylic acid group ($—CO_2H$)

(5) Sulfonic acid group ($—SO_3H$)

(6) Phosphoric acid group ($—OPO_3H_2$)

In the above-described groups (1) to (6), Ar represents a divalent connecting aryl group, optionally having one or more substituents and R represents a hydrocarbon group which may be substituted.

Among aqueous alkali solution-soluble polymers having an acidic group selected from the above-described groups (1) to (6), aqueous alkali solution-soluble polymers containing (1) a phenol group, (2) a sulfonamide group and/or (3) an active imide group are preferable, and, particularly, aqueous alkali solution-soluble polymers containing (1) a phenol group or (2) a sulfonamide group are most preferable from the standpoints of ensuring sufficient solubility in an alkali developing solution and film strength.

Examples of the aqueous alkali solution-soluble polymer containing an acidic group selected from the above-described groups (1) to (6) include the following polymers.

Examples of the aqueous alkali solution-soluble polymer containing (1) a phenol group include a novolak resin, a polymer having a hydroxyaryl group on the side chain thereof, and the like. Examples of the novolak resin include a resin obtained by condensing phenols and aldehydes under the acidic condition.

Of the novolak resin, examples of the preferable novolak resins include a novolak resin obtained from phenol and formaldehyde, a novolak resin obtained from m-cresol and formaldehyde, a novolak resin obtained from p-cresol and formaldehyde, a novolak resin obtained from o-cresol and formaldehyde, a novolak resin obtained from octylphenol and formaldehyde, a novolak resin obtained from m-/p-mixed cresol and formaldehyde, a novolak resin obtained from a mixture of phenol/cresol (any of m-, p-, o-, or m-/p-, m-/o-, o-/p-mixture may be used) and formaldehyde, and the like.

These novolak resin preferably have a weight average molecular weight of 800 to 200,000 and a number average molecular weight of 400 to 60,000.

Further, as the aqueous alkali solution-soluble polymer containing a phenol group, a polymer having a hydroxyaryl group on the side chain thereof is also preferable. In this polymer, the hydroxyaryl group refers to an aryl group to which one or more —OH groups are bonded.

Although a phenyl group, naphthyl group, anthracenyl group, phenanthrenyl group and the like are exemplified as the aryl group, the phenyl group and the naphthyl group are preferable in view of their easy availability and physical properties.

Therefore, as the hydroxyaryl group, a hydroxyphenyl group, dihydroxyphenyl group, trihydroxyphenyl group, tetrahydroxyphenyl group, hydroxynaphthyl group, dihydroxynaphthyl group or the like are preferable.

These hydroxyaryl groups may further have one or more substituents such as a halogen atom, a hydrocarbon group having no more than 20 carbon atoms, an alkoxy group having no more than 20 carbon atoms, an aryloxy group having no more than 20 carbon atoms or the like.

The hydroxyaryl group is bonded to a main chain forming polymer as a pendant-like side chain and may have a linking group between the side chain and the main chain.

The polymers, having hydroxyaryl groups on the side chains, which are suitably used in the embodiment of the present invention include polymers having at least one of the structural units, which are represented by the following formulae (IX) to (XII) and described in detail in paragraph numbers [0016] through [0030] of Japanese Patent Application No. 2000-144732 previously proposed by the present inventors. The structural units represented by the general formulae (IX) to (XII) will be described below.

(IX)

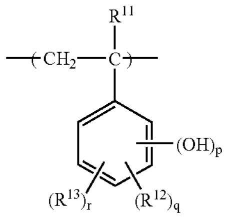

(X)

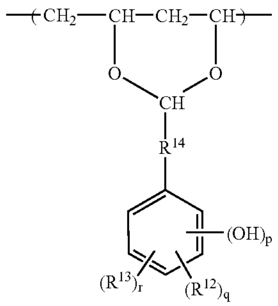

(XI)

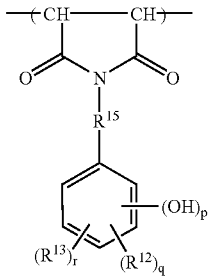

(XII)

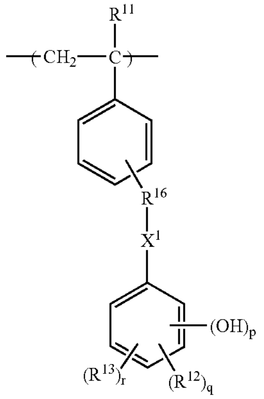

In the general formulae (IX) through (XII), $R^{11}$ represents a hydrogen atom or a methyl group. $R^{12}$ and $R^{13}$ may be the same or different and each represents a hydrogen atom, a halogen atom, a hydrocarbon group having no more than 10 carbon atoms, an alkoxy group having no more than 10 carbon atoms or an aryloxy group having no more than 10 carbon atoms. Further, $R^{12}$ and $R^{13}$ may be linked to each other and condensed to form a benzene ring or a cyclohexane ring. $R^{14}$ represents a single bond or a divalent hydrocarbon group having no more than 20 carbon atoms. $R^{15}$ represents a single bond or a divalent hydrocarbon group having no more than 20 carbon atoms. $R^{16}$ represents a single bond or a divalent hydrocarbon group having no more than 10 carbon atoms. $X^1$ represents a single bond, an ether bond, a thioether bond, an ester bond or an amide bond. p represents an integer with a value of from 1 to 4. q and r each independently represents an integer with a value of from 0 to 3.

Examples of the aqueous alkali solution-soluble polymer having (2) a sulfonamide group include polymers structured to have, as their main constituent, the minimum constituent unit derived from compounds having a sulfonamide group. As the above-described compound, compounds having one or more sulfonamide groups in which at least one hydrogen atom is bonded to a nitrogen atom and one or more polymerizable unsaturated groups are listed. Among these, compounds having a low molecular weight and an acryloyl group, allyl group or vinyloxy group and a substituted or mono-substituted aminosulfonyl group or a substituted sulfonylimino group are preferable, and specific examples thereof include the compounds represented by the general formulae (a) through (e) given below.

General formula (a)

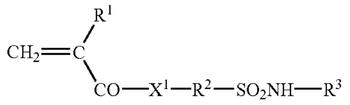

General formula (b)

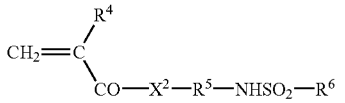

General formula (c)

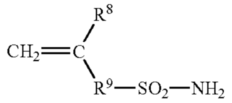

General formula (d)

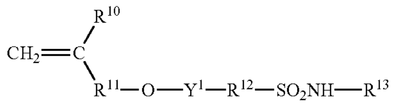

General formula (e)

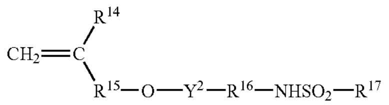

wherein $X^1$ and $X^2$ each represents —O—or —$NR^7$—; $R^1$ and $R^4$ each represents a hydrogen atom or —$CH^3$; $R^2$, $R^5$, $R^9$, $R^{12}$ and $R^{16}$ each represents an alkylene group, cycloalkylene group, arylene group or aralkylene group having 1 to 12 carbon atoms, and optionally having one or more substituents; $R^3$, $R^7$ and $R^{13}$ each represents a hydrogen atom or an alkyl group, cycloalkyl group, aryl group or aralkyl group having 1 to 12 carbon atoms, and optionally having one or more substituents; $R^6$ and $R^{17}$ each represents an alkyl group, cycloalkyl group, aryl group or aralkyl group having 1 to 12 carbon atoms, and optionally having one or more substituents; $R^8$, $R^{10}$ and $R^{14}$ each represents a hydrogen atom or —$CH^3$; $R^{11}$ and $R^{15}$ each represents a single bond or an alkylene group, cycloalkylene group, arylene group or aralkylene group having 1 to 12 carbon atoms, which may have a substituent; and $Y^1$ and $Y^2$ each represents a single bond, or —CO—.

Among those compounds represented by the general formulae (a) through (e), compounds which can be favorably used in the negative type planographic printing plate precursor of the present invention include m-aminosulfonylphenyl methacrylate, N-(p-aminosulfonylphenyl) methacrylamide, N- (p-aminosulfonylphenyl) acrylamide, or the like.

Examples of the aqueous alkali solution-soluble polymer having (3) an active imide group include polymers structured to have the minimum constituent unit derived from a compound having an active imide group as their main constituent. As the above-described compound, compounds having in the molecule one or more active imide groups and one or more polymerizable unsaturated groups represented by the following structural formula can be listed.

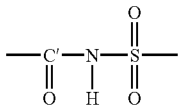

Specifically, N-(p-toluenesulfonyl) methacrylamide, N-(p-toluenesulfonyl) acrylamide or the like can be favorably used.

Examples of the aqueous alkali solution-soluble polymer having (4) a carboxyl group include polymers structured to have as their main constituent the minimum constituent unit derived from compounds having, in the molecule, one or more carboxylic acid groups and one or more polymerizable unsaturated groups.

Examples of the aqueous alkali solution-soluble polymer having (5) a sulfonic acid group include polymers structured to have, as their main constituent, the minimum constituent unit derived from compounds having one or more sulfonic acid groups and one or more polymerizable unsaturated groups.

Examples of the aqueous alkali solution-soluble polymer having (6) a phosphoric acid group include polymers structured to have, as their main constituent, a minimum constituent unit derived from compounds having one or more phosphoric acid groups and one or more polymerizable unsaturated groups.

The minimum constituent unit having an acidic group selected from the above-described groups (1) through (6), which constitutes the aqueous alkali solution-soluble polymer used for the material for the negative type planographic printing plate precursor of the present invention, does not need to be used singly. Polymers obtained by copolymerizing two or more minimum constituent units having the same acidic group or by copolymerizing two or more minimum constituent units each having different acidic groups can also be used.

As the copolymerization method, a conventionally known graft copolymerization method, block copolymerization method, random copolymerization method and the like, can be used.

The above-described copolymer preferably contains, in a copolymer, 10 mol % or more, and more preferably 20 mol % or more, of a compound containing at least one acidic group selected from the group consisting of (1) to (6) for copolymerization. If the content is less than 10 mol %, there is a tendency to be unable to sufficiently improve development latitude.

In the present invention, in a case in which a copolymer is formed by copolymerizing a compound, other compounds which do not contain an acidic group selected from the above-described groups (1) to (6) may also be used as the compound to form a copolymer. Examples of other compounds not containing acidic group selected from the above-described groups (1) to (6) include the compounds listed in the following (m1) to (m11).

(m1) Acrylic esters and methacrylic esters each of which have an aliphatic hydroxyl group and are exemplified by 2-hydroxyethyl acrylate, 2-hydroxyethyl methacrylate, or the like.

(m2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, and N-dimethylaminoethyl acrylate, and the like.

(m3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate, and the like.

(m4) Acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, and the like.

(m5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(m6) Vinyl esters such as vinyl acetate, vinyl chloroacetate, vinyl butyrate, vinyl benzoate, and the like.

(m7) Styrenes such as styrene, α-methylstyrene, methylstyrene, chloromethylstyrene, and the like.

(m8) Vinyl ketones such as methyl vinyl ketone, ethyl vinyl ketone, propyl vinyl ketone, phenyl vinyl ketone, and the like.

(m9) Olefins such as ethylene, propylene, isobutylene, butadiene, isoprene, and the like.

(m10) N-vinylpyrrolidone, N-vinylcarbazole, 4-vinylpyridine, acrylonitrile, methacrylonitrile, and the like.

(m11) Unsaturated imides such as maleimide, N-acryloylacrylamide, N-acetylmethacrylamide, N-propionylmethacrylamide, N-(p-chlorobenzoyl) methacrylamide, and the like.

In the present invention, as the hydrophobic aqueous alkali solution-soluble polymer, which is used as a constituent of the overcoat layer, a polymer having a weight-average molecular weight of 2,000 or more and a number-average molecular weight of 500 or more is preferable, and a polymer having a weight-average molecular weight of 5,000 to 300,000 and a number-average molecular weight of 800 to 250,000 is more preferable, in terms of the sensitivity and the development latitude, irrespective of whether the polymer is a homopolymer or a copolymer. Moreover, a polymer having a dispersion degree (weight-average molecular weight/number-average molecular weight) of 1.1 to 10 is preferable.

When a copolymer is used in the present invention, the weight ratio of the compound of the minimum constituent unit, which is derived from a compound having an acidic group selected from the above-described groups (1) to (6) and constitutes the main chain and/or the side chain of the copolymer, to another minimum constituent unit, which does not contain an acidic group selected from the above-described groups (1) to (6) and constitutes a part of the main chain and/or the side chain of the copolymer, is preferably in the range of from 50:50 to 5:95, and more preferably in the range of from 40:60 to 10:90, from the viewpoint of desired effects.

As the hydrophobic aqueous alkali solution-soluble polymer used in the present invention, a polymer having a carboxylic acid, oxyacid of phosphorus, oxyacid of sulfur, imide group, sulfonimide group, sulfonylimide group, or phenolic hydroxyl group as an alkali-soluble group is particularly preferable. In view of physical properties, an acid radical having a pKa (acid dissociation constant) of 14 or less is preferable.

These functional groups (acid radicals) allow the polymer to be alkali-soluble, while they act to enhance a hydrophilic property of the polymer. Therefore, it is preferable that the content of the functional group in the polymer be low to an extent which does not inhibit the alkali-solubility of the polymer. Preferably, an equivalence of the functional group content in a polymer (to 1 g of the polymer) is 0.1 to 12 mmg/g, and more preferably of 0.5 to 8 mmg/g.

The above-described aqueous alkali solution-soluble polymer may be used singly or in combinations of two or more.

The amount thereof may be 100% based on the total amount of solid contents in materials constituting the overcoat layer. However, with consideration of a possibility of using other components with the aqueous alkali solution-soluble polymer to improve a layer formability and a coated film characteristic, the amount is preferably in the range of from 30 to 99% by weight, more preferably in the range of from 45 to 95% by weight.

If the amount used of the aqueous alkali solution-soluble polymer is less than 30% by weight, the layer formability and the coated film characteristics of the overcoat layer tend to deteriorate, which is not desirable.

In the present invention, various additives can be used for the overcoat layer together with the above-described materials, as needed.

For example, heat decomposable compounds composed of an onium salt, aromatic surfonate or the like, which are described in paragraph number [0067], and thereafter, of Japanese Patent Application Laid-Open (JP-A) No. 11-174681 as "other components", which can be added to a positive type photosensitive composition, are suitable for adjusting an ability to suppress dissolution in image portions. Additives useful for improving sensitivity such as cyclic acid anhydrides, phenols, organic acids or the like, surfactants, printing-out agents, dyes and pigments serving as image coloring agents, or the like disclosed in JP-A No. 11-174681 as "other components" can be used as well in the present invention.

Further, phenol compounds, which have a hydroxymethyl group and which are described in Japanese Patent Application Laid-Open (JP-A) No. 8-276558, crosslinking compounds, which are able to suppress dissolution in alkali and are described in Japanese Patent Application Laid-Open (JP-A) No. 11-160860, epoxy compounds, vinyl ether compounds, or the like can be appropriately added to the overcoat layer of the present invention in response to the object.

Further, in the present invention, the overcoat layer is provided for the purpose of suppressing ablation generated at the photosensitive layer. Therefore, it is preferable that the overcoat layer does not contain components having sensitivity to light or heat, and that the overcoat layer itself does not have sensitivity to light or heat.

Although the weight of coating (solid content) obtained after drying varies depending on the application, the preferable amount of the dried overcoat layer coating is generally in the range of 0.01 to 2.0 $g/M^2$, more preferably of 0.05 to 1.0 $g/m^2$. Further, the preferable thickness of the coated overcoat layer is in the range of 0.01 to 2.0 μm, and more preferably of 0.05 to 1.0 μm. If the overcoat layer is too thin, the suppression of ablation becomes insufficient. If the overcoat layer is too thick, the sensitivity of the precursor to infrared rays tends to be reduced. Though the reason for the sensitivity reduction caused by the thickness of the overcoat layer which does not contain materials such as an infrared ray absorbing agent or the like and has an excellent light transmitting property is unclear, it is assumed that, because heat generated by exposure with an infrared ray laser is diffused into the thick overcoat layer, the temperature of the photosensitive layer does not sufficiently rise, and exposure energy is not efficiently used for image forming.

[Photosensitive Layer Containing a Crosslinkable or Polymerizable Compound, and In Which an Ability to be Dissolved into an Alkaline Developing Solution Reduces by Being Affected by Light or Heat]

The planographic printing plate precursor of the present invention is formed by providing, on a substrate, a photosensitive layer having sensitivity to infrared rays, and the above-described overcoat layer in that order, and the description will be given of this photosensitive layer.

The photosensitive layer is provided directly or optionally through an undercoat layer and/or an intermediate layer on a substrate. The photosensitive layer of the present invention contains a compound which is crosslinkable or polymerizable. At the photosensitive layer, an infrared ray absorbing agent generates heat by being heated or exposed with infrared ray laser. Due to the heat generated thereby, a reaction to form covalent bonding takes place in the crosslinkable or polymerizable compound. Accordingly, only exposed (heated) portions of the photosensitive layer are cured, the ability of the exposed (heated) portions to be dissolved into an alkali developing solution deteriorates, and the exposed (heated) portions manifest a non-soluble characteristic to an alkali developing solution. On the other hand, in non-exposed portions of the photosensitive layer, solubility in an alkali developing solution is maintained, and high solubility in an alkali developing solution is exhibited therein. Therefore, after development, negative type images having a good image quality with no residual films can be formed on the photosensitive layer.

There are no specific limitations to the reaction which can form the above-described covalent bonding. If the photosensitive layer can reduce the solubility in the alkali developing solution and form images with a required intensity, then any of a known radical polymerization reaction, cationic polymerization reaction, anionic polymerization reaction, condensation polymerization reaction, addition polymerization reaction or the like can be applied. Further, a reaction, in which polymers having polymerizable functional groups are bonded by being crosslinked and cured, may also be applied.

A representative example of the photosensitive layers which form the covalent bonding and cure as described above, is a photopolymerization layer. The photopolymerization layer contains (A) a infrared ray absorbing agent, (B) a radical generating agent (radical polymerization initiator), and (C) a radical polymerizable compound which polymerizably reacts with the generated radicals and cures, and preferably, further contains (D) a binder polymer. Due to heat generated at the exposed or heated areas, the radical polymerization initiator such as onium salts or the like is decomposed and generates radicals. The radical polymerizable compound is selected from the compounds having at least one ethylenically unsaturated double bond, at least one terminal ethylenically unsaturated bond, and preferably, two or more terminal ethylenically unsaturated bonds. In the photopolymerization layer, a chained polymerization reaction is caused by the radicals generated therein, and the photopolymerization layer cures.

Another aspect of the photosensitive layer is an acid crosslinking layer. The acid crosslinking layer contains (E) a compound (hereinafter, referred to as an acid generating agent) which generates acid by being exposed with light or heat and (F) a crosslinking compound (hereinafter, referred to as a crosslinking agent) which crosslinks by the generated acid, and further contains (G) an alkali-soluble polymer which can react with the crosslinking agent under the existence of acid and is used for forming a layer containing (E) and (F). At this acid crosslinking layer, acid generated by the acid generating agent being decomposed by light irradiation or heating accelerates an effect of the crosslinking agent. Rigid crosslinking structures are formed between the crosslinking agents and/or between the crosslinking agent and the binder polymers, and the alkali-solubility of the acid crosslinking layer thereby deteriorates so that portions of the acid crosslinking layer, which were irradiated or heated, become insoluble in the developing solution. At this time, (A) an infrared ray absorbing agent is preferably blended in the photosensitive layer to efficiently use energy of an infrared laser.

Hereinafter, a description of each of the compounds used for the photosensitive layer of the negative type planographic printing plate precursor will be given.

[(A) Infrared Ray Absorbing Agent]

By containing the infrared ray absorbing agent, the photosensitive layer of the planographic printing plate precursor according to the present invention is formed in such a manner as to be capable of recording images using lasers emitting infrared rays. There is no specific limitation to the infrared ray absorbing agent used herein, and a known infrared ray absorbing agent having a function to convert the absorbed infrared rays to heat can be suitably selected. The infrared ray absorbing agent is exposed with infrared rays emitted from the infrared laser to generate heat, the radical generating agent and the acid generating agent decompose due to the heat generated and generates radicals and acids. Dyes and pigments having a wavelength absorption maximum in a range of 760 nm to 1200 nm are used in the present invention as the infrared ray absorbing agents.

The dyes which can be used may be any known dyes, such as commercially available dyes or dyes described in, for example, "Dye Handbook" (Senryo Binran) (edited by the Organic Synthetic Chemistry Association, published in 1970). Specifically, for example, those described in paragraph numbers [0050] to [0051] of Japanese Patent Application Laid-Open (JP-A) No. 10-39509 can be used.

Among these dyes, particularly preferable dyes are cyanine dyes, squalilium dyes, pyrylium salts, and nickel thiolate complexes. Cyanine dyes are preferable, and a cyanine dye represented by the general formula (I) described below is the most preferable.

General formula (I)

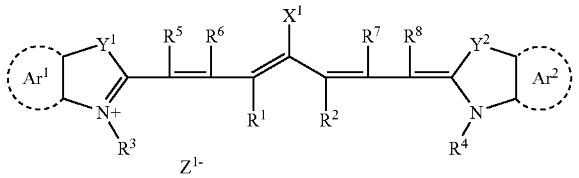

In the general formula (I), $X^1$ represents a halogen atom, $X^2$-$L^1$ or $NL^2L^3$. Wherein, $X^2$ represents an oxygen atom or a sulfur atom, $L^1$ represents a hydrocarbon group having 1 to 12 carbon atoms, $L^2$ and $L^3$ each independently represents a hydrocarbon group having 1 to 12 carbon atoms. $R^1$ and $R^2$ each independently represents a hydrocarbon group having 1 to 12 carbon atoms. In terms of storage stability of the photosensitive layer coating solution, it is preferable that $R^1$ and $R^2$ each represents a hydrocarbon group having greater than 2 carbon atoms, and particularly preferably, $R^1$ and $R^2$ are bonded together and form 5- or 6-membered ring.

$Ar^1$ and $Ar^2$ may be the same or different and each represents an aromatic hydrocarbon group which may have one or more substituents, $Y^1$ and $Y^2$ may be the same or different and each represents a sulfur atom or dialkylmethylene group having no more than 12 carbon atoms, $R^3$ and $R^4$ may the same or different and each represents a hydrocarbon group which may have substituents and have no more than 20 carbon atoms. Examples of the preferable substituents include an alkoxy group, carboxyl group, and sulfo group having no more than 12 carbon atoms. $R^5$, $R^6$, $R^7$ and $R^8$ may be the same or different, and each represents a hydrogen atom or a hydrocarbon group having no more than 12 carbon atoms; a hydrogen atom is preferable in terms of availability of the materials. Further, $Z^{1-}$represents a counter anion. However, when any of $R^1$ to $R^8$ are substituted with a sulfo group, $Z^{1-}$is unnecessary. Examples of the preferable $Z^{1-}$include, in terms of the storage stability of the photosensitive layer coating solution, a halogen ion, perchloric acid ion, tetrafluoroborate ion, hexafluorophosphate ion, and sulfonic acid ion, and a perchloric acid ion, hexafluorophosphate ion, and arylsulfonic acid ion are particularly preferable.

Specific examples of the cyanine dyes suitably used in the present invention and represented by the general formula (I) include those described in paragraph numbers [0017] to [0019] of Japanese Patent Application No. 11-310623.

The pigments which can be used in the present invention include commercially available pigments, and pigments described in the Color Index (C. I.) Handbook, "Latest Pigment Handbook" (Saishin Ganryo Binran) edited by Japan Pigment Technical Association, published in 1977, "Latest Pigment Applied Technology" (Saishin Ganryo Oyo Gijutsu), CMC publications, published in 1986 and "Printing Ink Technology" (Insatsu Inki Gijutsu), CMC publications, published in 1984.

Examples of the pigments include black pigments, yellow pigments, orange pigments, brown pigments, red pigments, purple pigments, blue pigments, green pigments, fluorescent pigments, metal powder pigments, and polymer bonded pigments.

These pigments are described in detail in paragraph numbers [0052] to [0054] of Japanese Patent Application Laid-Open (JP-A) No. 10-39509, and those described therein can be applied in the present invention. Among these pigments, carbon black is preferable.

These infrared ray absorbing agents may be added to the same layer together with other components, or another layer may be provided to which the infrared ray absorbing agents are added. In other words, the photosensitive layer may be comprised of multiple layers. When a negative type planographic printing plate precursor is produced using these infrared ray absorbing agents, it is preferable for a photosensitive layer to have an optical density of 0.1 to 3.0 at an absorption maximum at a wavelength of from 760 nm to 1200 nm. In a case in which the optical density is out of the aforementioned range, sensitivity of the photosensitive layer tends to be low. Since the optical density is determined with an added amount of the infrared ray absorbing agent and a thickness of a recording layer, a predetermined optical density can be obtained by controlling the added amount of the infrared ray absorbing agent and the thickness of a recording layer. The optical density of the photosensitive layer can be determined by standard methods. Examples of the determination methods thereof include a method in which a photosensitive layer having a thickness which is suitably determined to have a dried coating weight within a range required for a planographic printing plate is formed on a transparent or white substrate and the optical density of the photosensitive layer is then determined by a transparent type optical densitometer, a method in which a photosensitive layer is formed on a substrate which is made of aluminum or the like and has a reflectivity and a reflection density is then determined, and the like.

[(B) Compounds Which Generate Radicals]

Examples of compounds suitably used in the present invention and generates radicals include onium salts such as iodonium salts, diazonium salts, and sulfonium salts. These onium salts can function as acid generating agents. Moreover, when these onium salts are used together with radical polymerizable compounds, which will be described later, they are function as initiators of radical polymerization. Examples of the onium salts suitably used in the present invention include the onium salts represented by general formulae (II) to (IV) given below.

General formula (II)

$Ar^{11}—I^{+}—Ar^{12}$ $Z^{11-}$

General formula (III)

$Ar^{21}—N^{+}\equiv N$ $Z^{21-}$

General formula (IV)

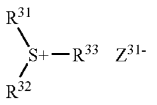

In the general formula (II), $Ar^{11}$ and $Ar^{12}$ each independently represents an aryl group having no more than 20 carbon atoms and optionally having one or more substituents. Examples of the preferable substituents used in a case in which the aryl group has one or more substituents include a halogen atom, nitro group, alkyl group having no more than 12 carbon atoms, alkoxy group having no more than 12 carbon atoms, or aryloxy group having no more than 12 carbon atoms. $Z^{11-}$represents a counter ion selected from a group consisting of a halogen ion, perchloric acid ion, tetrafluoroborate ion, hexafluorophosphate ion, and a sulfonic acid ion, and preferably, a counter ion selected from a group consisting of a perchloric acid ion, hexafluorophosphate ion, and arylsulfonic acid ion.

In the general formula (III), $Ar^{21}$ represents an aryl group having no more than 20 carbon atoms, and optionally having one or more substituents. Examples of the preferable substituents include a halogen atom, nitro group, alkyl group having no more than 12 carbon atoms, alkoxy group having no more than 12 carbon atoms, aryloxy group having no more than 12 carbon atoms, alkylamino group having no more than 12 carbon atoms, dialkylamino group having no more than 12 carbon atoms, arylamino group having no more than 12 carbon atoms, and diarylamino group having no more than 12 carbon atoms. $Z^{21-}$represents a counter ion having the same meaning as the counter ion represented by $Z^{11-}$.

In the general formula (IV), $R^{31}$, $R^{32}$ and $R^{33}$ may be the same or different and each represents a hydrocarbon group having no more than 20 carbon atoms, and optionally having one or more substituents. Examples of the preferable substituents include a halogen atom, nitro group, alkyl group having no more than 12 carbon atoms, alkoxy group having no more than 12 carbon atoms, and aryloxy group having no more than 12 carbon atoms. $Z^{31-}$represents a counter ion having the same meaning as the counter ion represented by $Z^{11-}$.

Specific examples of onium salts which can be suitably used in the present invention include those described in paragraph numbers [0030] to [0033] of Japanese Patent Application No. 11-310623, which was previously proposed by the applicant of the present invention, and those described in paragraph numbers [0015] to [0046] of Japanese Patent Application No. 2000-160323.

Preferably, the onium salts used in the present invention have a maximum absorption wavelength of 400 nm or less, and more preferably, of 360 nm or less. By setting the absorption wavelength as described above, treatments of the planographic printing plate precursor can be carried out under a white light.

These onium salts can be added in a coating solution of a photosensitive layer in an amount of from 0.1 to 50% by weight, preferably from 0.5 to 30% by weight, and particularly preferably from 1 to 20% by weight, based on the total amount of solid contents in the coating solution of the photosensitive layer. An amount of the onium salts of less than 0.1% by weight causes low sensitivity, but an amount of more than 50% by weight produces smudges in non-image portions at the time of printing. The onium salts may be used singly or in combinations of two or more. These salts may be added to the same layer together with other components, or another layer may be provided to which the onium salts are added.

[(C) Radical Polymerizable Compounds]

The radical polymerizable compounds used in the photosensitive layer according to the present invention are radical polymerizable compounds each having at least one ethylenically unsaturated double bond and selected from compounds having at least one, and preferably two or more, terminal ethylenically unsaturated bond. Such a compound group is widely known in the industrial field of the invention, it can be used in the present invention with no specific limitation. These compounds each may have a chemical formation such as a monomer and a prepolymer, i.e., a dimer, trimer, oligomer, a mixture thereof, a copolymer thereof, or the like. Examples of the monomer and the copolymer thereof include an unsaturated carboxylic acid (for example, an acrylic acid, methacrylic acid, itaconic acid, crotonic acid, isocrotonic acid, maleic acid, and the like), esters thereof, and amides thereof; and esters formed by an unsaturated carboxylic acid and an aliphatic polyhydric alcohol compound, or amides formed by reacting an unsaturated carboxylic acid and an aliphatic polyhydric amine compound are preferably used. Further, an unsaturated carboxylic acid ester having one or more nucleopetal substituents such as a hydroxyl group, amino group, mercapto group or the like; an addition product formed by amides and monofunctional or polyfunctional isocyanates or epoxys; a dehydrated condensation product formed by amides and a monofunctional or polyfunctional carboxylic acid; or the like can be suitably used. Moreover, an addition product formed by amides or unsaturated carboxylates which contain one or more electrophile substituents such as isocyanate groups, epoxy groups or the like, and monofunctional or polyfunctional alcohols, amines or thiors; and a substituted product formed by amides or unsaturated carboxylic acid esters which contain one or more eliminated substituents such as halogen groups, tosyloxy groups or the like, and monofunctional or polyfunctional alcohols, amines or thiors; are suitably used as the radical polymerizable compounds in the photosensitive layer of the present invention. Further, as another example thereof, it is possible to use a compound group wherein the above-mentioned unsaturated carboxylic acid is substituted with an unsaturated phosphonic acid, styrene or the like.

Specific examples of an acrylic ester, methacrylate, itaconate, crotonate, isocrotonate, and maleate, each of which is an ester used as a radical polymerizable compound and obtained by a reaction of an aliphatic polyhydric alcohol compound and an unsaturated carboxylic acid include those described in paragraph numbers [0037] to [0042] of Japanese Patent Application No. 11-310623, and those described therein can be applied in the present invention as well.

Other examples of esters suitably used in the present invention include aliphatic alcohol-based esters described in Japanese Patent Application Publication (JP-B) Nos. 46-27926 and 51-47334, and Japanese Patent Application Laid-Open (JP-A) No. 57-196231, esters each having an aromatic skeleton described in Japanese Patent Application Laid-Open (JP-A) Nos. 59-5240, 59-5241, and 2-226149, esters containing one or more amino groups described in Japanese Patent Application Laid-Open (JP-A) No. 1-165613, and the like.

Specific examples of the monomer of the amide which is obtained by a reaction of the aliphatic polyhydric amine compound and the unsaturated carboxylic acid include a methylenebis-acrylamide, methylenebis-methacrylamide, 1, 6-hexamethylenebis-acrylamide, 1, 6-hexamethylenebis-methacrylamide, diethylenetriaminetrisacrylamide, xylylenebisacrylamide, xylylenebismethacrylamide, and the like.

As examples of other preferable amide-based monomers, those having a cyclohexylene structure, described in Japanese Patent Application Publication (JP-B) No. 54-21726 can be used.

An urethane-based addition polymerizable compound produced by using an addition reaction of an isocyanate and a hydroxyl group is also suitable as the radical polymerizable compound used for the photosensitive layer of the present invention, and specific examples thereof include a vinyl urethane compound containing two or more polymerizable vinyl groups in a molecule, which is produced by adding a vinyl monomer containing a hydroxyl group represented by the formula (V) described below to a polyisocyanate compound containing two or more isocyanate groups in a molecule, and is described in Japanese Patent Application Publication (JP-B) No. 48-41708.

$$CH_2{=}C(R^{41})\ COOCH_2CH(R^{42})OH \qquad \text{General formula (V)}$$

($R^{41}$ and $R^{42}$ represents H or $CH_3$)

Further, urethane acrylates described in Japanese Patent Application Laid-Open (JP-A) No. 51-37193, Japanese Patent Application Publication (JP-B) Nos. 2-32293 and 2-16765, and urethane compounds having an ethyleneoxide-based skeleton, described in Japanese Patent Application Publication (JP-B) Nos. 58-49860, 56-17654, 62-39417, and 62-39418, are also suitable as the radical polymerizable compound used for the photosensitive layer of the present invention.

Furthermore, radical polymerizable compounds having an amino structure or a sulfide structure in a molecule, described in Japanese patent Application Laid-Open (JP-A) Nos. 63-277653, 63-260909, and 1-105238 may be used.

Examples of other radical polymerizable compounds usable for the photosensitive layer of the present invention include a polyfunctional acrylate and methacrylate such as polyesteracrylates, epoxyacrylates in which an epoxy resin is reacted with a (metha) acrylic acid, or the like described in Japanese Patent Application Laid-Open (JP-A) No. 48-64183 and Japanese Patent Application Publication (JP-B) Nos. 49-43191 and 52-30490. Further, specific unsaturated compounds described in Japanese Patent Application Publication (JP-B) Nos. 46-43946, 1-40337, and 1-40336, vinyl phosphonic acid-based compounds described in Japanese Patent Application Laid-Open (JP-A) No. 2-25493, and the like can be further included. In some cases, a structure containing a perfluoroalkyl group described in Japanese Patent Application Laid-Open (JP-A) No. 61-22048 is suitably used. Furthermore, those introduced as photo-curing monomers and oligomers in "Journal of the Adhesion Society of Japan" (Nihon Setchaku Kyokaishi), Vol. 20, No. 7, pp. 300–308 (1984) can be used.

Details of the application method for these radical polymerizable compounds, such as the type of structure to be used, whether they are used singly or in combination, the amount to be added or the like, can be optionally set in accordance with the ultimate performance design of the recording material. In terms of sensitivity, a structure with a high content of the unsaturated group in a molecule is preferable, and a structure containing a bifunctional unsaturated group in a molecule or a structure containing a greater content of unsaturated group in a molecule is preferable in many cases. In order to enhance intensity in image portions, i.e., a curing film, a radical polymerizable compound with a trifunctional unsaturated group in a molecule or with a greater content of unsaturated group in a molecule is applicable, and a method which adjusts both the photosensitivity and the intensity by using compounds (e.g., acrylic ester-based compounds, methacrylate-based compounds, styrene-based compounds, or the like) each having different numbers of functional groups and different polymerizable groups in combination is also effectively used.

In many cases, preferable compounding ratio of the radical polymerizable compound is from 5 to 80% by weight, and more preferably from 20 to 75% by weight, based on the total amount of components in the composition. These radical polymerizable compounds can be used singly or in combinations of two or more. Further, in the application method of the radical polymerizable compound, the appropriate structure, compounding ratio, and added amount can be optionally selected from the standpoints of the degree of inhibiting polymerization caused by oxygen, resolution, property of fogging, change in a refractive index, surface tackiness or the like of the radical polymerizable compound. Further, in some cases, a layer structure, i.e., a coating method such as an undercoat and an overcoat, can be applied.

[(D) Binder Polymer]

In the photosensitive layer of the present invention, it is preferable to use a binder polymer adding to the above-described (A), (B) and (C), and a linear organic polymer is preferably used as a binder. Any of linear organic polymers can be used as such a "linear organic polymer". Preferably, a water- or alkalescent water-soluble or swellable linear organic polymer is selected to allow a development by water or a development by alkalescent water. The linear organic polymer is selected not only as a coating forming agent for forming a photosensitive layer, but also in accordance with the application of a water, alkalescent water or organic solvent developing agent. For example, if a water-soluble organic polymer is used in the photosensitive layer, development by water is enabled. Examples of such a linear organic polymer include a radical polymer containing a carboxylic group on a side chain described, for example, in Japanese Patent Application Laid-Open (JP-A) No. 59-44615, Japanese Patent Application Publication (JP-B) Nos. 54-34327, 58-12577 and 54-25957, Japanese Patent Application Laid-Open (JP-A) Nos. 54-92723, 59-53836 and 59-71048, i.e., a methacrylic acid copolymer, acrylic acid compolymer, itaconic acid copolymer, crotonic acid copolymer, maleic acid copolymer, partially esterificated maleic acid copolymer, an acidic cellulose derivative containing a carboxylic group on a side chain, and the like. In addition, a polymer containing one or more hydroxyl groups and to which a cyclic acid anhydride is added is also usable as a linear organic polymer.

Among these, a (metha) acrylic resin containing a benzyl group or allyl group and a carboxylic group on a side chain has an excellent balance in a coating intensity, sensitivity, and developability, and is thus particularly suitable.

Further, as a binder polymer, "the aqueous alkali solution-soluble polymer" used in the overcoat layer can also be used.

The binder polymers used in the present invention may be used singly, in combinations of two or more, or may be mixed with other compounds. These polymers can be added to the photosensitive layer in an amount of 20 to 95% by weight, and preferably 30 to 90% by weight, based on the total amount of solid contents in the photosensitive layer coating solution. If the amount is less than 20% by weight, the intensity of image portions at the time of image forming is insufficient, but if the amount is over 95% by weight, images are not formed. Further, the weight ratio of a radical polymerizable compound containing one or more ethylenically unsaturated double bonds to the linear organic polymer is preferably in the range of from 1/9 to 7/3.

Next, a description will be given for constituents of the acid crosslinking layer. Though the infrared ray absorbing agent herein is not necessarily used as an essential component, it is preferable for the acid crosslinking layer to contain the infrared ray absorbing agent from the standpoint of sensitivity improvement.

Examples of an infrared ray absorbing agent, which can be used in the acid crosslinking layer, are the infrared ray absorbing agents which are the same as those described in (A) in the photopolymerization layer.

Preferably, content of the infrared ray absorbing agent in the acid crosslinking layer is an amount which results in an optical sensitivity of the photosensitive layer of from 0.1 to 3.0, as previously described in (A) describing the infrared ray absorbing agents used in the photosensitive layer.

[(E) Acid Generating Agent]

In the embodiment of the present invention, the acid generating agent which is decomposed by heat and generates acid denotes a compound which generates acid by being irradiated with light having a wavelength of from 200 to 500 nm, or by being heated to at least 100° C.

Examples of the acid generating agent include known compounds which may be decomposed by heat and generate acid, mixtures thereof and the like, such as photo-initiators for photocationic polymerization, photo-initiators for photoradical polymerization, photo-color extinguishing agents for pigments, photo-tarnishing agents, known acid generating agents used in a microresist, or the like.

As examples of the aforementioned acid generating agents, known compounds illustrated in paragraph numbers [0089] to [0092] of Japanese Patent Application No. 2000-144732 previously proposed by the applicant of the present invention are cited.

Among these, compounds represented by the general formulae (VI) to (X) disclosed in Japanese Patent Application No. 2000-144732 are preferable. The compounds represented by the general formulae (VI) to (X) will be given below.

General formula (VI)

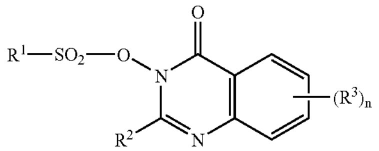

General formula (VII)

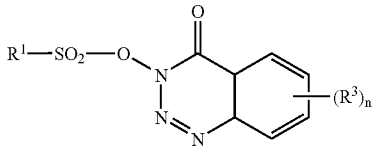

General formula (VIII)

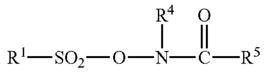

General formula (IX)

$Ar^1-SO_2-SO_2-Ar^2$

General formula (X)

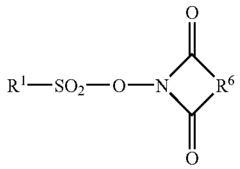

In the general formulae (VI) to (X), $R^1$, $R^2$, $R^4$, and $R^5$ each represents a hydrocarbon group having no more than 20 carbon atoms, which may be the same or different and may be substituted. $R^3$ represents a halogen atom, hydrocarbon group having no more than 10 carbon atoms and optionally having one or more substituents, or alkoxy group having no more than 10 carbon atoms and optionally having one or more substituents. $Ar^1$ and $Ar^2$ each represents an aryl group having no more than 20 carbon atoms, which may be the same or different and may be substituted. $R^6$ represents a bivalent hydrocarbon group having no more than 20 carbon atoms and optionally having one or more substituents. n represents an integer with a value of from 0 to 4.

In the above-described formulae, $R^1$, $R^2$, $R^4$, and $R^5$ each preferably represents a hydrocarbon group having from 1 to 14 carbon atoms.

Preferable aspects of the acid generating agents represented by the general formulae (VI) to (X) are described in detail in paragraph numbers [0197] to [0222] of Japanese Patent Application No. 11-320997 previously proposed by the present inventors. These compounds can be synthesized by, for example, methods described in Japanese Patent Application Laid-Open (JP-A) Nos. 2-100054 and 2-100055.

Examples of (E) the acid generating agent further include onium salts containing a halide, sulfonic acid or the like as a counter-ion. Among the aforementioned onium salts, onium salts having one of any structural formulae of an iodonium salt, sulfonium salt, or diazonium salt, represented by the general formula (XI) to (XIII) given below, can suitably be used.

In the general formula (XI) to (XIII), $X^-$represents a halide ion, $Ar^3-I^+-Ar^4X^-$ General formula (XI)

General formula (XII)

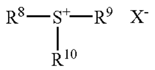

$Ar^3-N_2^+X^-$ General formula (XIII)

$ClO_4^-$, $PF_6^-$, $SbF_6^-$, $BF_4^-$, or $R^7SO_3^-$, wherein $R^7$ represents a hydrocarbon group having no more than 20 carbon atoms, and optionally having one or more substituents. $Ar^3$ and $Ar^4$ each independently represents an aryl group having no more than 20 carbon atoms, and optionally having one or more substituents. $R^8$, $R^9$, and $R^{10}$ each represents a hydrocarbon group having no more than 18 carbon atoms, and optionally having one or more substituents.

These onium salts are described as compounds represented by the general formulae (I) to (III) in paragraph numbers [0010] to [0035] of Japanese Patent Application Laid-Open (JP-A) No. 10-39509.

The amount added of the acid generating agent is preferably from 0.01 to 50% by weight, more preferably from 0.1 to 25% by weight, and most preferably from 0.5 to 20% by weight, based on the total amount of solid contents constituting the photosensitive layer.

If the amount is less than 0.01% by weight, images may not be obtained, but an amount of more than 50% by weight may produce smudges in nonimage portions at the time of printing when constituting a planographic printing plate.

The above-described acid generating agents may be used singly or in combinations of two or more.

[(F) Crosslinking Agent]

Next, a description of the crosslinking agent will be given. As the crosslinking agent, those described below can be used.

(i) Aromatic compounds substituted with one or more hydroxymethyl groups or alkoxymethyl groups.

(ii) Compounds containing one or more N-hydroxymethyl groups, N-alkoxymethyl groups, or N-acyloxymethyl groups.

(iii) Epoxy compounds

Hereinafter, a detailed description of the above-described compounds (i) to (iii) will be made.

Examples of (i) the aromatic compounds substituted with one or more hydroxymethyl groups or alkoxymethyl groups include aromatic compounds or heterocyclic compounds substituted with two or more hydroxymethyl groups, acetoxymethyl groups, or alkoxymethyl groups. However, a resinous compound known as a resol resin, produced by condensation-polymerizing phenols and aldehydes under a basic condition is also included.

Among the aromatic compounds or heterocyclic compounds substituted with two or more hydroxymethyl groups or alkoxymethyl groups, compounds containing hydroxymethyl groups or alkoxymethyl groups in positions adjacent to hydroxy groups are preferable.

Further, among the aromatic compounds or heterocyclic compounds substituted with two or more alkoxymethyl groups, compounds containing alkoxymethyl groups having no more than 18 carbon atoms are preferable, and compounds represented by general formulae (XIV) to (XVII) given below are more preferable.

General formula (XIV)

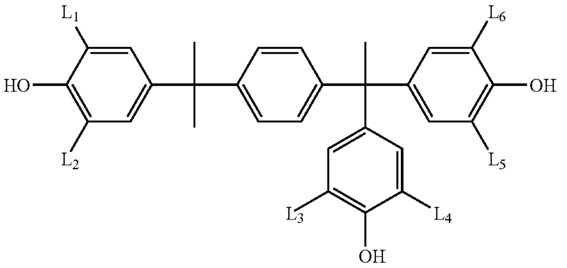

General formula (XV)

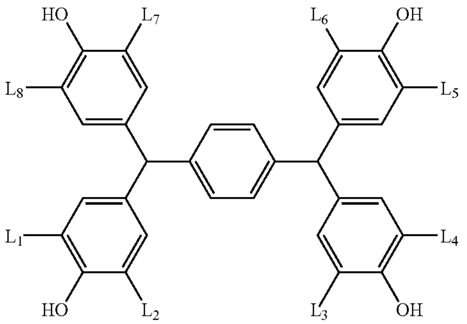

General formula (XVI)

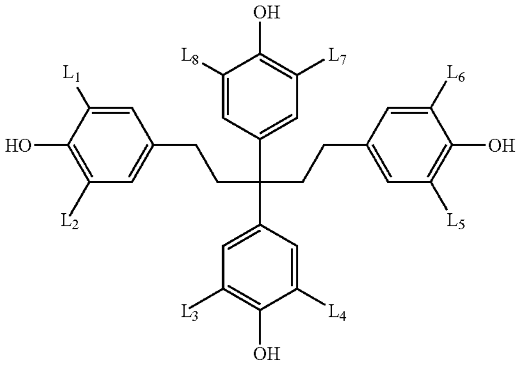

-continued

General formula (XVII)

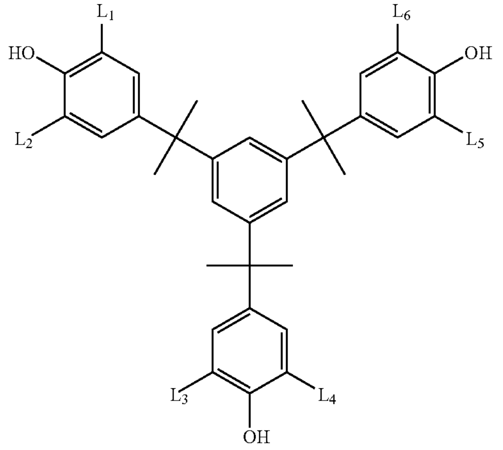

In the general formulae (XIV) to (XVII), $L_1$ to $L_8$ each independently represents a hydroxymethyl group or alkoxymethyl group each obtained by a substitution with alkoxy group having no more than 18 carbon atoms, such as a methoxymethyl, ethoxymethyl or the like.

These crosslinking agents are preferable since they have high crosslinking efficiencies and are capable of improving the printing durability.

Examples of (ii) the compounds containing one or more N-hydroxymethyl groups, N-alkoxymethyl groups or N-acyloxymethyl groups include monomers, monomer or oligomer-melamine-formaldehyde condensates and urea-formaldehyde condensates, described in European Patent Application Laid-Open (hereinafter, referred to as "EP-A") No. 0133,216 and West Germany Patent Nos. 3,634,671 and 3,711,264, alkoxy substituted compounds described in EP-A No. 0,212,482, and the like.

Among these, for example, melamine-formaldehyde derivatives containing at least two free N-hydroxymethyl groups, N-alkoxymethyl groups or N-acyloxymethyl groups are preferable, and N-alkoxymethyl derivatives are most preferable.

(iii) Examples of the epoxy compounds include epoxy compounds each containing one or more epoxy groups and having a form of monomer, dimer, oligomer or polymer. Examples thereof include reaction products of bisphenol A and epichlorohydrine, reaction products of low molecular weight phenol-formaldehyde resin and epichlorohydrine, and the like. Other examples thereof include epoxy resins respectively described and used in U.S. Pat. No. 4,026,705 and British Patent No. 1,539,192.

The amount of each of the compounds (i) to (iii) to be added when used as crosslinking agents is preferably from 5 to 80% by weight, more preferably from 10 to 75% by weight, and most preferably from 20 to 70% by weight, based on the total amount of solid contents constituting the photosensitive layer.

If the amount is less than 5% by weight, durability of the photosensitive layer in the obtained image recording material may deteriorate. On the other hand, if the amount is more than 80% by weight, stability of the photosensitive layer when being stored may deteriorate.

In the present invention, a phenol derivative represented by general formula (XVIII) can be suitably used as a crosslinking agent.

General formula (XVIII)

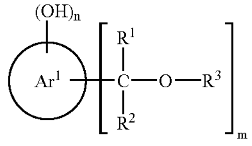

In the general formula (XVIII), $Ar^1$ represents an aromatic hydrocarbon ring which may have substituents.

In terms of availability of the materials, the aromatic hydrocarbon ring is preferably a benzene ring, naphthalene ring or anthracene ring. As substituents thereof, a halogen atom, hydrocarbon group having no more than 12 carbon atoms, alkoxy group having no more than 12 carbon atoms, alkylthio group having no more than 12 carbon atoms, cyano group, nitro group, trifluoromethyl group, or the like is preferable.

Among the above-described, in terms of enabling high sensitization, a benzene ring or naphthalene ring which may not be substituted, and a benzene ring or naphthalene ring containing, as substituents, a halogen atom, a hydrocarbon group having no more than 6 carbon atoms, alkoxy group having no more than 6 carbon atoms, alkylthio group or nitro group having no more than 6 carbon atoms, are preferably used as $Ar^1$.

[(G) Aqueous Alkali Solution-soluble Polymer Compound]

Among the aqueous alkali solution-soluble polymers previously described in detail in the description of the constituents of the overcoat layer, a novolak resin, a polymer having a hydroxyaryl group on the side chain thereof, or the like can be particularly used as an aqueous alkali solution-soluble polymer compound usable in the crosslinking layer according to the present invention. As the novolak resin, a resin produced by condensing phenols and aldehydes under an acidic condition can be used.

In the present invention, the above-described cured areas in the photosensitive layer form image portions. Preferably, the overcoat layer existing on a surface of the image portion is removed promptly by developing. Therefore, it is preferable that the aqueous alkali solution-soluble polymer forming the photosensitive layer and that forming the overcoat layer be incompatible with each other.

Here, the phrase, "incompatible with each other", means that the combination of two kinds of polymers (which includes the cases in which the respective polymers are a copolymer or a single phase mixture of more than two kinds of polymers) does not produce a single phase solid body or a liquid. The fact that two kinds of polymers are "incompatible with each other" can be verified by mixing those polymers and then observing the obtained mixture visually or by taking cross-sectional photographs of the mixture by a scanning electron microscope.

Examples of the basic polymer compounds used for combinations of two or more kinds of polymers which are incompatible with each other include an urethane polymer compound, acrylic polymer compound, styrene polymer compound, novolak resin, diazo resin, amide polymer compound, polyether compound, and the like. These polymers can be made soluble in an alkali developing solution by introducing the above-described acidic groups. Incidentally, suitable combinations of the above-described polymer compounds are a combination of an acrylic or urethane-based polymer compound and a novolak resin, a combination of a novolak resin and a diazo resin, and a combination of acrylic or urethane-based polymer compound and a diazo resin.

[Other Components]

In the present invention, various compounds other than those described above can be added in the photosensitive layer as needed. For example, dyes having a large absorption in visible radiation areas can be used as image colorants. Further, pigments such as a phthalocyanine-based pigment, azo-based pigment, carbon black, and titanium oxide can also be suitably used.

Addition of these colorants is preferable since then discrimination between image portions and non-image portions after formation of images is apt to be clear. The amount added of these colorants is from 0.01 to 10% by weight based on the total amount of solid contents in the photosensitive layer coating solution.

Further, in the present invention, in a case in which the photosensitive layer is a photo-polymerization layer, addition of a small amount of thermal polymerization inhibitor is desirable to inhibit unnecessary thermal polymerization of compounds having radical polymerizable ethylenically unsaturated double bonds during preparation or preservation of coating solutions. Examples of the proper thermal polymerization inhibitor include a hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis (4-methyl-6-t-butylphenol), N-nitroso-N-phenylhydroxylamine aluminum salt, and the like. The amount added of the thermal polymerization inhibitor is preferably about 0.01% by weight to about 5% by weight based on the total weight of the composition. Further, a higher fatty acid derivative such as a behenic acid or a behenic acid amide may be added to the coating solution and unevenly distributed on the surface of the photosensitive layer in a drying process after coating, as needed to prevent polymerization inhibition caused by oxygen. The amount added of the higher fatty acid derivative is preferably from about 0.1% by weight to about 10% by weight, based on the total amount of the composition.

Moreover, in the photosensitive layer coating solution of the present invention, nonionic surfactants such as those described in Japanese Patent Application Laid-Open (JP-A) Nos. 62-251740 and 3-208514, and ampholytic surfactants such as those described in Japanese Patent Application Laid-Open Nos. 59-121044 and 4-13149 can be added to improve processing stability with respect to the development condition.

Further, to the photosensitive layer coating solution according to the present invention, a plasticizer may be added to provide flexibility of the coating film or the like, if necessary. Examples of the usable plasticizer include a polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and the like.

The photosensitive layer of the planographic printing plate precursor of the present invention is formed by coating a coating solution, which is prepared by dissolving the above-described components required for the photosensitive layer coating solution in a solvent, on an appropriate substrate. Some illustrative nonlimiting examples of the solvent usable herein include an ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurca, N-methylpyrrolidone, dimethyl sulfoxide, sulfolane, γ-butyrolactone, toluene, water, and the like. These solvents may be used singly or in combinations of two or more. The concentration of the above-described component (total solid contents including additives) in the solvent is preferably from 1 to 50% by weight.

Other than the above-described photopolymerization layer and the acid crosslinking layer, known photosensitive layers having covalent bond forming properties can be applied as a photosensitive layer according to the present invention. Specifically, for example, a combination of an infrared ray absorbing agent and a diazonium compound containing two or more diazonio groups in a molecule, described in Japanese Patent Application Laid-Open (JP-A) No. 7-306528 and previously proposed by the applicants of the present invention, a negative type image recording material containing an infrared ray absorbing agent and a polymer compound which has a specific repeated unit having side chains which generates acid by heat, described in Japanese Patent Application Laid-Open (JP-A) No. 9-43845, or the like, are applicable as components of the photosensitive layers.

Referring to the coated amount of these photosensitive layers, though the coated amount (solid content) on the substrate after being coated and dried varies depending on the applications, the preferable amount is generally from 0.1 to 5.0 g/$m^2$ when used as a planographic printing plate precursor.

Various methods can be used as a method for coating a photosensitive layer. Examples thereof include bar coating, rotational coating, spraying, curtain coating, dipping, air-knife coating, blade coating, and roll coating.

[Substrate]

A substrate used in the present invention is a dimensionally stable plate-like material. Specific examples thereof include paper, paper laminated with a plastic (e.g., polyethylene, polypropylene and polystyrene), metal plates (e.g., aluminum, zinc and copper), plastic films (e.g., cellulose diacetylate, cellulose triacetylate, cellulose propionate, cellulose butyrate, cellulose butyrate acetate, cellulose nitrate, polyethylene terephthalate, polyethylene, polystyrene, polypropylene, polycarbonate, and polyvinyl acetal), and paper or plastic films laminated or vapor-deposited with the aforementioned metals.

Among these materials, a polyester film and an aluminum plate are preferable. An aluminum plate which is dimensionally stable and relatively economical is particularly preferable. Examples of the favorable aluminum plate include a pure aluminum plate and a plate of an aluminum alloy containing aluminum as a main component together with a trace of other elements and may further include a plastic film which is laminated or vapor-deposited with aluminum. Examples of other elements which may be contained in the aluminum alloy include silicon, iron, manganese, copper, magnesium, chromium, zinc, bismuth, nickel, and titanium. The content of other elements in the aluminum alloy is 10% by weight or less. Although the pure aluminum is particularly suitable for use in the present invention, the aluminum may contain a small amount of other elements because it is difficult to produce perfectly pure aluminum with known purification technologies. Accordingly, the composition of the aluminum plate to be applied in the present invention is not particularly limited, and an aluminum plate of conventionally known materials can be used appropriately.

The thickness of the aluminum plate used in the present invention is about 0.1 to 0.6 mm, preferably 0.15 to 0.4 mm, and most preferably 0.2 to 0.3 mm.

The aluminum plate is surface-roughened before it is used. Prior to the surface-roughening of the aluminum plate, if desired, a degreasing treatment is performed in order to remove rolling oils from a surface of the aluminum plate by means of, for example, a surfactant, an organic solvent, an aqueous alkali solution, or the like.

The surface-roughening of the aluminum plate may be performed using a variety of methods. Examples of these methods include a method in which the surface is mechanically roughened, a method in which the surface is roughened by being electrochemically dissolved, and a method in which the surface is selectively and chemically dissolved. As the mechanical methods, conventionally known methods such as ball ablation, brushing, blasting, and buffing may be used. As the electrochemical methods, electrolysis of the aluminum plate in a hydrochloric acid or a nitric acid electrolyte solution using an alternating current or a direct current can be used. A combination of a mechanical method and an electrochemical method is also applicable as described in JP-A No. 54-63902.

If necessary, the surface-roughened aluminum plate is subjected to an alkali-etching treatment and a neutralizing treatment. The aluminum plate is then subjected to an anodizing treatment to increase the water retention and wear resistance of the surface thereof, if desired. A variety of electrolytes capable of producing a porous oxide film can be used as electrolytes for the anodizing treatment of the aluminum plate. Generally, a sulfuric acid, phosphoric acid, oxalic acid, chromic acid, or a mixture thereof is used. The concentration of the electrolytes may be appropriately determined depending on the types of the electrolytes.

Conditions for the anodizing vary depending on the types of electrolyte and electrolyte solutions employed and cannot be specified unqualifiedly. However, generally employed conditions are as follows: concentration of the electrolyte solution is 1 to 80% by weight; temperature of the solution is 5 to 70° C. ; current density is 5 to 60 $A/m^2$; voltage is 1 to 100V; and duration of the electrolysis is 10 seconds to 5 minutes. If the amount of the anodized layer is less than 1.0 $g/m^2$, the surface has insufficient printing durability and the non-image portions of the resulting planographic printing plate are liable to receive scratches, which collect printing ink at the time of printing and produce so-called "scratch smudge".

If necessary, the anodized aluminum plate surface may be rendered hydrophilic by applying a surface treatment. Examples of this hydrophilic treatment used in the present invention include an alkali metal silicate (such as an aqueous sodium silicate solution) method as disclosed in U.S. Pat. Nos. 2,714,066, 3,181,461, 3,280,734, and 3,902,734, in which the substrate is immersed or electrolytically treated in an aqueous sodium silicate solution. Further examples are a treatment of the surface with a potassium fluorozirconate as disclosed in Japanese Patent Application Publication (JP-B) No. 36-22063 and a treatment of the surface with a polyvinylphosphonic acid as disclosed in U.S. Pat. Nos. 3,276,868, 4,153,461 and 4,689,272.

If necessary, an undercoat layer may be provided between the substrate and the polymer layer. Various organic compounds may be used as components of the undercoat layer. For example, an organic compound constituting the undercoat layer is selected from a group consisting of a carboxymethyl cellulose, dextrin, gum arabic, phosphonic acids having an amino group such as 2-aminoethylphosphonic acid, organic phosphonic acid such as a phenylphosphonic acid which may have a substituent, naphthylphosphonic acid, alkylphosphonic acid, glycerophosphonic acid, methylenediphosphonic acid, and ethylenediphosphonic acid, organic phosphoric acids, such as a phenylphosphoric acid, which may have a substituent, naphthylphosphoric acid, alkylphosphoric acid, and glycerophosphoric acid, organic phosphinic acids, such as phenylphosphinic acid which may have a substituent, naphthylphosphinic acid, alkylphosphinic acid, and glycerophosphinic acid, amino acids, such as a glycine and β-alanine, and hydrochloric acid salt of amine having a hydroxy group such as a hydrochloric acid salt of triethanolamine. These compounds may be used singly or may be used in combinations of two or more.

In the present invention, polyfunctional amine compounds may be added into the undercoat layer as described above. In this case, the undercoat layer may be formed together with the above-described or other organic compounds, or may be formed by the polyfunctional amine compound alone.

The proper coated amount of the undercoat layer is in the range of from 2 to 200 $mg/M^2$ and preferably in the range of from 5 to 100 $mg/M^2$. If the coated amount is less than 2 $mg/m^2$, a sufficient printing durability may not be obtained. On the other hand, if the coated amount exceeds 200 $mg/M^2$, the same undesirable result may occur.

The planographic printing plate precursor produced is generally subjected to an image exposure and developing treatment to carry out a plate-making.

As a light source of active light rays used for the image exposure, a light source having a light emitting wavelength from an near-infrared area to an infrared area is preferable, and a solid laser or a semiconductor laser is particularly preferable. Incidentally, upon a local adjustment of a hardness of a photosensitive layer which is a feature of the planographic printing plate precursor of the present invention, the hardness of the photosensitive layer is effectively controlled by adjusting an optical density of the photosensitive layer and an output energy of an infrared ray laser used for an exposure to adjust the quantity of laser light which may reach deep portions of the photosensitive layer.

[Developing Solution]

A conventionally known aqueous alkali solution can be used as a developing solution and a replenisher to be used for development and plate-making of the planographic printing plate precursor according to the present invention.

The developing solution and the developing replenisher used for the development of the planographic printing plate precursor of the present invention is an aqueous alkali solution having a pH of from 9.0 to 13.5, and more preferably of from 10.0 to 13.3.

For example, the aqueous alkali solution is an aqueous solution of an inorganic alkali salt such as a sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, or lithium hydroxide. In addition, an organic alkaline agent can also be used for the preparation of the aqueous alkali solution. Examples of the organic alkaline agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and the like. These alkaline agents are used singly or in combinations of two or more.

Among the aqueous alkali solutions prepared with the above-described alkaline agents, a particularly preferred example of the developing solution is an aqueous solution of a silicate such as a sodium silicate or potassium silicate. This is because the adjustment of developability of a developing solution is enabled by varying the ratio of silicon oxide $SiO_2$ to alkali metal oxide $M_2O$, each of which constitutes the silicate, and the concentration of the silicate in the solution. For example, alkali metal silicates described in JP-A No. 54-62004 and JP-B No. 57-7427 are effectively used in the present invention. Incidentally, such alkaline developing solutions are described in detail in paragraph numbers [0132] to [0144] of Japanese patent Application No. 2000-144732 previously proposed by the present inventors, and those described therein are applicable in the present invention as well.

The planographic printing plate after being developing-processed with the developing solution and the replenisher described above is then subjected to a post-treatment such as a treatment with rinsing water, a treatment with a rinsing solution containing a surfactant or the like, or a treatment with a desensitizing solution containing gum arabic or a starch derivative. A combination of these treatments may be employed as a post-treatment when a printing plate produced by plate-making the planographic printing plate precursor of the present invention by the above-described process.

Recently, for the purpose of rationalization and standardization of plate-making operations, automated developing machines in which printing plates are processed have become used widely in the plate-making and printing industries. The planographic printing plate precursor obtained by the present invention can be processed by the automated developing machine. Generally, the automated developing machine is made up of a developing part and a post-treating part, each comprising a device, which transfers a printing plate, together with tank(s) filled with processing solutions and spraying device(s), in which the printing plate after exposure travels horizontally so that it is processed with the processing solutions which are moved up by means of pumps and sprayed from spray nozzles. Further, a method, in which a printing plate is immersed and transferred in a processing tank filled with a processing solution by means of immersed guide rolls or the like, is known as well. In the above-described automated processing, the processing can be performed by supplying replenisher to the processing solutions in accordance with processed volume, operational period of time or the like. Further, a so-called single-use solution system (disposable solution system), in which a printing plate is processed with a substantially unused processing solution, can also be employed in the present invention.

A planographic printing plate which has been subjected to the above-described processing is coated with a desensitizing gum, if desired, and can then be used in a printing process. However, for the purpose of enhancing printing durability of the printing plate, a burning treatment may be applied to the printing plate. In a case in which the printing plate undergoes the burning treatment, it is desirable to process the printing plate with a surface-adjusting solution such as those described in JP-B Nos. 61-2518 and 55-28062 and JP-A Nos. 62-31859 and 61-159655, prior to the burning treatment. As a method of the burning treatment, a method in which the planographic printing plate is coated with a surface-adjusting solution by using a sponge or absorbent cotton soaked with the surface-adjusting solution; a method in which the planographic printing plate is immersed in a vat filled with a surface-adjusting solution; a method in which the planographic printing plate is coated with a surface-adjusting solution by means of an automated coater; or the like are applicable. If the coated amount is homogenized by means of a squeegee device such as squeegee rollers after the coating, a better result is obtained.

The suitable coated amount of the surface-adjusting solution is generally in the range of from 0.03 to 0.8 $g/m^2$ (dry weight).

After the planographic printing plate coated with the surface-adjusting solution is dried, the planographic printing plate may be heated at a high temperature by means of a burning processor (e.g., Burning Processor BP-1300 manufactured by Fuji Film Co., Ltd.). In this case, the temperature and time vary depending on the kind of components constituting the image, but a desirable temperature and time are 180 to 300° C. and 1 to 20 minutes.

After the burning, if necessary, the planographic printing plate may be subjected to conventionally employed treatments such as water-rinsing and gum-coating. However, in a case in which the surface-adjusting solution containing an aqueous water-soluble polymer compound or the like is used, a so-called desensitizing treatment such as gum-coating may be omitted.

The planographic printing plate thus obtained is mounted on an offset printing machine or the like and then can be used for printing a large number of sheets.

EXAMPLES

Hereinafter, the present invention is described in detail with reference to examples. However, the present invention is not limited to the same.

[Preparation of a Substrate]

After an aluminum plate (type 1050) having a thickness of 0.30 mm was washed with trichloroethylene to degrease it, the plate surface was sand-blasted using a nylon brush and an aqueous suspension of 400 mesh pumice and washed well with water. This plate was immersed in a 25% aqueous solution of sodium hydroxide at 45° C. for 9 seconds to etch it, washed with water, immersed in 2% $HNO_3$ for 20 seconds and again washed with water. At this point, the etched amount of the sand-blasted surface was about 3 $g/m^2$. Then, after 3 $g/m^2$ of a direct current-anodized oxide film was formed on this plate using 7% $H_2SO_4$ as an electrolysis solution at a current density of 15 $A/dm^2$, the plate was washed with water and dried.

[Undercoating]

Then, the following undercoat solution 1 was coated on this aluminum substrate and dried at 90° C. for 30 seconds using a hot blast type drier. The coated amount after drying was 10 $mg/m^2$.

| <Undercoat solution 1> | |
|---|---|
| Copolymer having a molar ratio of ethylmethacrylate to sodium 2-acrylamide-2-methyl-1-propane sulfonate of 75:15 | 0.1 g |
| 2-aminoethylphosphonic acid | 0.1 g |

-continued

| <Undercoat solution 1> | |
|---|---|
| Methanol | 50 g |
| Ion exchanging water | 50 g |

[Photosensitive Layer]

Next, the following photosensitive layer coating solution [P-1] was prepared. The prepared solution [P-1] was coated on the aluminum plate which had been coated with the above-mentioned undercoating solution using a wire bar, followed by drying at 115° C., for 45 seconds using a hot air type drier to form a photosensitive layer. The coated amount after drying was in the range of from 1.2 to 1.3 g/m$^2$.

| <Photosensitive layer coating solution [P-1] > | |
|---|---|
| Infrared ray absorbing agent (IR-6) | 0.20 g |
| Onium salt (SB-1) | 0.30 g |
| Dipentaerythritolhexacrylate | 1.00 g |
| Copolymer of allylmethacrylate and methacrylic acid having a molar ratio of 80:20 (weight average molecular weight: 12,000) | 1.00 g |
| Naphthalene sulfonate of Victoria Pure Blue | 0.04 g |
| Silicon-based surfactant (TEGO GLIDE 100 (trade name) manufactured by Tego Chemie Service GmbH) | 0.03 g |
| Methylethylketone | 9.0 g |
| Methanol | 10.0 g |
| 1-methoxy-2-propanol | 8.0 g |

The structures of the infrared ray absorbing agent (IR-6) and onium salt (SB-1) used in the above-mentioned photosensitive layer coating solution [P-1] will be given below.

[IR-6]

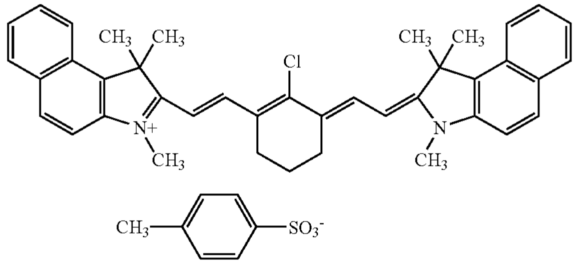

(SB-1)

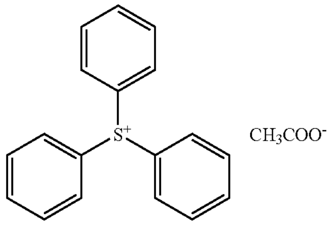

[Overcoat Layer]

The following overcoat layer coating solution 1 was prepared. The prepared solution 1 was coated on the aluminum plate, which had been coated with the undercoat solution 1 and the photosensitive layer coating solution [P-1] in that order, using a slide hopper, followed by drying at 120° C. for 1 minute by a hot air type drier to obtain a planographic printing plate precursor of Example 1 having an overcoat layer on the surface thereof. The coated amount of the overcoat layer is 0.3 g/m$^2$. An angle of contact with atmospheric droplets on the surface of the planographic printing plate precursor on which the overcoat layer had been formed was measured using a CA-Z manufactured by Kyowa Surfactant Science, Ltd. The contact angle was about 70 degrees, and the surface of the planographic printing plate precursor had a desirable hydrophobic property.

| <Overcoat layer coating solution 1> | |
|---|---|
| 10% by weight dispersion solution of copolymer of succinic acid monoacryloyloxyethyl ester and ethyl methacrylate (molar ratio thereof was 20:80) | 30 g |
| Nonionic surfactant (EMAREX NP-10 manufactured by Japan Emulsion Co., Ltd.) | 0.05 g |
| Ion exchanging water | 69.95 g |

[Evaluation of Ablation]

The surface of the photosensitive layer of the planographic printing plate obtained was covered with a polyethylene telephthalate (PET) film and exposed with a printing plate surface energy of 200 mJ/cm$^2$ using Trendsetter 3244VFS manufactured by Creo Co., on which a water cooling type 40W infrared semiconductor laser was mounted. After the exposure, the PET film was removed and a state of ink adhering to the PET film was visually determined. There was no ink adhered to the film and thus found that there was no ablation generated on the surface of the photosensitive layer of the planographic printing plate.

[Evaluation of Inking Property]

The following composition [G] serving as a developing solution and 1:1 aqueous solution of FP-2W, serving as a mucilage (gum solution), manufactured by Fuji Film Co., Ltd., were put into a STABLON 900NP, which was an automated developing machine manufactured by Fuji Film Co., Ltd. The above-described planographic printing plate precursor which had been exposed was subjected to a development and gum-coating treatment using the STABLON 900NP to obtain a planographic printing plate. The obtained planographic printing plate was printed using a RISLON which was a printer manufactured by Komori Corporation Ltd. After printing was started, a visual determination was made of how many sheets of paper were needed until a print on which a sufficient amount of ink was applied was obtained. 20 sheets of paper were needed until a print on which a sufficient amount of ink was applied was obtained.

| <Developing solution [G]> | |
|---|---|
| Potassium sulfite | 0.05% by weight |
| Potassium hydroxide | 0.1% by weight |
| Potassium carbonate | 0.2% by weight |
| Ethyleneglycolmononaphthylether | 4.8% by weight |
| Tetrasodium salt of EDTA | 0.13% by weight |
| Silicon-based surfactant | 0.02% by weight |
| Water | 94.7% by weight |

Comparative Example 1

A planographic printing plate precursor was obtained in the same manner as in Example 1, except that an overcoat layer was not formed on a substrate.

An angle of contact with atmospheric droplets on the surface of the photosensitive layer was determined as in Example 1 and the result was about 70 degrees. It was thus found that the surface of the photosensitive layer exhibited hydrophobicity.

The planographic printing plate precursor of Comparative example 1 thus obtained was evaluated in a same manner as in Example 1. First, an evaluation of ablation was carried out. As a result of the evaluation, it was observed that a PET film removed from the photosensitive layer surface after the exposure was slightly colored with green, and the generation of ablation was acknowledged.

Further, an evaluation of inking property was carried out in a same manner as in Example. The result showed that, after printing was started, 20 sheets of paper were required until a print on which a sufficient amount of ink was applied was obtained.

Comparative Example 2

A planographic printing plate precursor of Comparative Example 2 was obtained as in Example 1, except that the following over coat layer coating solution 2 was coated, in place of the above-described overcoat layer coating solution of the present invention, on a photosensitive layer formed on a substrate.

An angle of contact with atmospheric droplets on the surface of the photosensitive layer of the planographic printing plate precursor was then measured as in Example 1. The result indicated a state of spreading leakage. The value of the angle was 10 degrees or less, and it was thus found that the photosensitive layer surface was hydrophilic.

| <Overcoat layer coating solution 2> | |
|---|---|
| Polyvinyl alcohol (degree of saponification: 98.5 mol%, degree of polymerization: 500) | 3.0 g |
| Nonionic surfactant (EMAREX NP-10 manufactured by Japan Emulsion Co., Ltd.) | 0.05 g |
| Ion exchanging water | 96.95 g |

The planographic printing plate precursor of Comparative Example 2 thus obtained was evaluated in a same manner as in Example 1. First, an evaluation of ablation was carried out. As a result of the evaluation, it was observed that a PET film removed from the photosensitive layer surface of the planographic printing plate precursor after the exposure was not colored, and thus found that ablation was not generated thereon.

Further, an evaluation of inking property was carried out in a same manner as in Example 1. The result showed that 60 sheets of paper were required, after printing was started, until a print on which a sufficient amount of ink was applied was obtained.

In this way, it was determined that the planographic printing plate precursor comprising an overcoat layer containing a hydrophobic aqueous alkali solution-soluble polymer according to the present invention suppressed the generation of ablation at the time of exposure and had an superior inking property.

Example 2

[Synthesis of a Specific Copolymer 1]

Into a 500 ml three-necked flask equipped with a stirrer, cooling tube and dropping funnel was put 31.0 g (0.36 mol) of methacrylic acid, 39.1 g (0.36 mol) of ethyl chloroformate and 200 ml of acetonitrile and the mixture thereof was stirred while cooling in an ice-water bath. To this mixture was added dropwise 36.4 g (0.36 mol) of triethylamine through a dropping funnel over approximately 1 hour. After the completion of the addition, the ice-water bath was removed, and the mixture was stirred for 30 minutes at room temperature.

To this reaction mixture, 51.7 g (0.30 mol) of p-aminobenzenesulfonamide was added. The mixture was stirred for 1 hour while being warmed in an oil bath to 70° C. After the completion of the reaction, the resulting mixture was mixed into 1 L of water while this water was stirred, and the resulting mixture was stirred for 30 minutes. This mixture was filtrated to obtain a precipitate, and 500 ml of water was added to the precipitate to prepare a slurry. This slurry was then filtrated, and the resulting solid was dried to obtain a white solid of N-(p-aminosulfonylphenyl) methacrylamide (yield: 46.9 g).

Then, into a 20 ml three-necked flask equipped with a stirrer, cooling tube and dropping funnel was charged 4.61 g (0.0192 mol) of N-(p-aminosulfonylphenyl) methacrylamide, 2.94 g (0.0258 mol) of ethyl methacrylate, 0.80 g (0.015 mol) of acrylonitrile and 20 g of N, N-dimethylacetamide, and the mixture was stirred while being heated in a hot bath to 65° C. To this mixture was added 0.15 g of "V-65" (manufactured by Wako Pure Chemical Industries Ltd.) and the mixture was stirred for 2 hours under nitrogen flow while the temperature thereof was maintained at 65° C. To this reaction mixture was further added dropwise a mixture of 4.61 g of N-(p-aminosulfonylphenyl) methacrylamide, 2.94 g of ethyl methacrylate, 0.80 g of acrylonitrile, 20 g of N, N-dimethylacetamide and 0. 15 g of V-65 through a dropping funnel over a period of 2 hours. After the completion of the addition, the resulting mixture was further stirred for 2 hours at 65° C. After the completion of the reaction, 40 g of methanol was introduced into the mixture and the resulting mixture was cooled and added into 2 L of water while this water was being stirred, and the mixture was stirred for 30 minutes. The precipitate was then removed by filtration and dried to obtain 15g of a white solid. The weight-average molecular weight (polystyrene standard) of this specific copolymer 1 was measured by gel permeation chromatography and was found to be 53,000.

[Production of Substrate]

An aluminum plate (material 1050) having a thickness of 0.3 mm was degreased by being washed with trichloroethylene, the plate surface was then sand-blasted using a nylon brush and an aqueous suspension of 400 mesh pumice and washed well with water. This plate was immersed in a 25% aqueous solution, of sodium hydroxide at 45° C. for 9 seconds to etch it, washed with water, immersed in 20% nitric acid solution for 20 seconds and washed again with water. At this point, the etched amount of the sand-blasted surface was about 3 $g/m^2$. Then, after 3 $g/m^2$ of a direct current-anodized oxide film was formed on this plate using 7% sulfuric acid solution as an electrolysis solution at a current density of 15 $A/dm^2$, the plate was washed with water, dried, and further processed with 2.5 weight % of aqueous sodium silicate solution at 30° C. for 10 second. The plate was then coated with an undercoat solution 2 described below, and the resulting coating film was dried at 80° C. for 15 seconds to obtain a substrate. The amount coated of the coating film after drying was 15 $mg/m^2$.

| <Undercoat solution 2> | |
|---|---|
| The following copolymer having a molecular weight of 28,000 | 0.3 g |
| Methanol | 100 g |
| Water | 1 g |

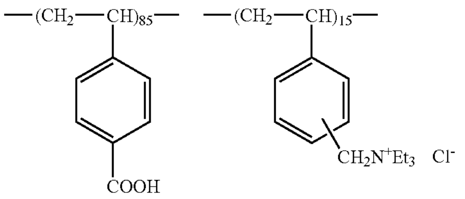

Molecular weight: 28,000

The following photosensitive layer coating solution [P-2] was prepared. The photosensitive solution [P-2] was coated on the obtained substrate so as to have a coated amount of 1.3 $g/m^2$, to obtain a planographic printing plate 1.

| <Photosensitive layer coating solution [P-2]> | |
|---|---|
| Fluorine-containing polymer P-6 (with the following structure) | 0.03 g |
| Specific copolymer 1 | 0.75 g |
| m, p-cresolnovolak (having a m:p ratio of 6:4, weight average molecular weight of 3,500, and containing 0.5 weight % of unreacted cresol) | 0.25 g |
| p-toluenesulfonic acid | 0.003 g |
| Tetrahydrophthalic anhydride | 0.03 g |
| Cyanine dye A (with the following structure) | 0.03 g |
| Dye in which counter ion of Victoria Pure Blue BOH was substituted with 1-naphthalenesulfonic acid anion | 0.015 g |
| 3-methoxy-4-diazodiphenylaminehexafluorophosphate | 0.02 g |
| Fluorine-containing surfactant (Megafack F-177, manufactured by Dainippon Ink & Chemicals, Inc.) | 0.05 g |
| γ-butyrolactone | 10 g |
| Methylethylketone | 10 g |
| 1-methoxy-2-propanol | 8 g |

Fluorine-containing surfactant (Megafack F-177, manufactured by Dainippon Ink & Chemicals, Inc.)

0.05 g

γ-butyrolactone 10 g

Methylethylketone 10 g 1-methoxy-2-propanol 8 g

Cyanine dye A

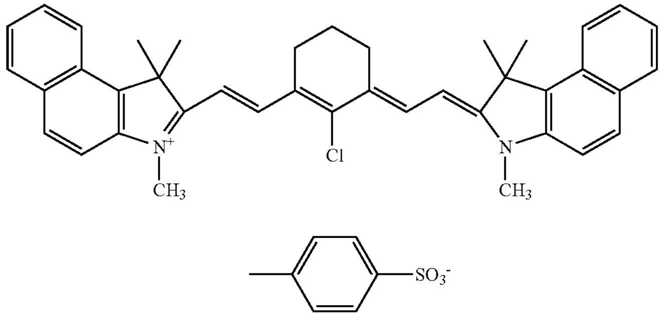

P-6

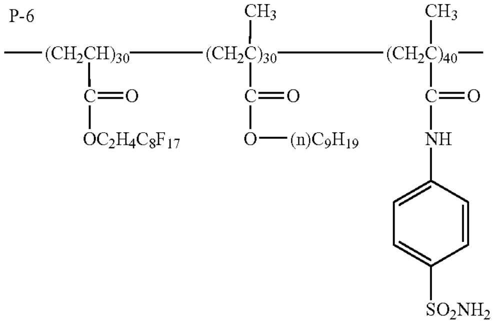

[Overcoat Layer]

The following overcoat layer coating solution 2 was prepared. The prepared solution 2 was coated on the photosensitive layer using a slide hopper, followed by drying at 120° C. for 1 minute by a hot air type drier to obtain a planographic printing plate precursor of Example 2 having an overcoat layer on the surface thereof. The coated amount of the overcoat layer was 0.3 $g/m^2$. An angle of contact atmospheric droplets on the surface of the planographic printing plate precursor on which the overcoat layer had been formed was measured as in Example 1. The contact angle was about 70 degrees, and the surface of the planographic printing plate precursor had a desirable hydrophobic property.

| <Overcoat layer coating solution 3> | |
|---|---|
| 10% by weight water dispersion of a copolymer of styrene and p-vinyl benzoic acid (molar ratio was 80:20) | 30 g |
| Nonionic surfactant (EMAREX NP-10 manufactured by Japan Emulsion Co., Ltd.) | 0.05 g |
| Ion exchanging water | 69.95 g |

[Evaluation of a Ablation]

The surface of the photosensitive layer of the obtained planographic printing plate precursor was covered with a PET film and whether or not ablation was generated was visually determined as in Example 1. As a result, it was found that there was no color adhered to the PET film and thus found that there was no ablation generated on the surface of the photosensitive layer of the planographic printing plate.

[Evaluation of Inking Property]

Then, the inking property of the above-described planographic printing plate which had been exposed was evaluated in a same manner as in Example 1, except that the developing solution [G] was substituted with a developing solution [H]. The result showed that 20 sheets of paper were needed, after printing was started, until a print on which a sufficient amount of ink was applied was obtained.

| <Developing solution [H]> | |
|---|---|
| D sorbitol | 2.5% by weight |
| Sodium hydroxide | 0.85% by weight |
| Pentasodium salt of diethylenetriaminepenta (methylene phosphonic acid) | 0.05% by weight |
| Water | 96.6% by weight |

Comparative Example 3

A planographic printing plate precursor of Comparative example 3 was obtained in the same manner as in Example 2, except that an overcoat layer was not formed on a substrate.

An angle of contact with atmospheric droplets on the surface of the photosensitive layer was measured as in Example 1 was about 70 degrees. It was thus found that the surface of the planographic printing plate precursor of Comparative example 3 exhibited a hydrophobic property.

The planographic printing plate precursor of Comparative example 3 thus obtained was evaluated in a same manner as in Example 1. First, an evaluation of ablation was carried out. As a result of the evaluation, it was observed that a PET film removed from the photosensitive layer surface of the planographic printing plate after the exposure was slightly colored with green, and generation of ablation was acknowledged.

Further, an evaluation of inking property was carried out in a same manner as in Example 1. The result showed that 15 sheets of paper were needed, after printing was started, until a print on which a sufficient amount of ink was applied was obtained.

Comparative Example 4

A planographic printing plate precursor of Comparative Example 4 was obtained as in Example 1, except that the following over coat layer coating solution 4, in place of the above-described overcoat layer coating solution of the present invention, was used for a photosensitive layer formed on a substrate.

An angle of contact with atmospheric droplets on the surface of the photosensitive layer of the planographic printing plate precursor of Comparative Example 4 was measured as in Example 1. The result indicated a state of spreading leakage. The value of the angle was 10 degrees or less, and it was thus found that the surface of the photosensitive layer was hydrophilic.

| <Overcoat layer coating solution 4> | |
|---|---|
| Sodium carboxymethylcellulose | 3.0 g |
| Nonionic surfactant (EMAREX NP-10 manufactured by Japan Emulsion Co., Ltd.) | 0.05 g |
| Ion exchanging water | 96.95 g |

The planographic printing plate precursor of Comparative Example 4 thus obtained was evaluated in a same manner as in Example 1. First, an evaluation of ablation was carried out. As a result of the evaluation, it was found that a PET film removed from the photosensitive layer surface of the planographic printing plate precursor of Comparative Example 4 after the exposure was not pigmented, and found that ablation was not generated thereon.

Further, an evaluation of inking property was carried out in a same manner as in Example 1. The result showed that 80 sheets of paper were needed, after printing was started, by the time that a print on which a sufficient amount of ink was applied was obtained.

In this way, it was determined that the planographic printing plate precursor comprising an overcoat layer containing a hydrophobic aqueous alkali solution-soluble polymer according to the present invention suppressed the generation of ablation at the time of exposure and had an superior inking property.

According to the present invention, there was provided a negative type planographic printing plate precursor which can be used for direct plate making by performing recording thereon based on digital data from a computer and the like using a solid laser or a semiconductor laser which emit infrared rays, has high sensitivity to an infrared laser, suppresses ablation generated on the photosensitive layer when recording is performed, has an excellent inking property, and in addition, is capable of suppressing paper loss, which is caused by the insufficient ink application at the time of printing.

What is claimed is:

1. A negative planographic printing plate precursor which is capable of directly making a printing plate using an infrared laser comprising:

a substrate;

a photosensitive layer disposed on the substrate, the photosensitive layer including a light-to-heat conversion agent and a compound, which is at least one of crosslinkable and polymerizable, with solubility of the photosensitive layer in an alkali developing solution being decreased by the effect of at least one of light and heat; and an overcoat layer including a polymer, which is hydrophobic and soluble in an aqueous alkali solution and which does not have sensitivity to an infrared laser, wherein the substrate, photosensitive layer and overcoat layer are provided in that order;

the photosensitive layer is a photopolymerization layer comprising an infrared ray absorbing agent, a radical generating agent, and a radical polymerizable compound which polymerizes with the generated radicals and cures; and the radical generating agent is at least one onium salt.

2. The negative planographic printing plate precursor according to claim 1, wherein the overcoat layer is formed on the photosensitive layer.

3. The negative planographic printing plate precursor according to claim 1, wherein the hydrophobicity is expressed by a contact angle with water of at least 50 degrees.

4. The negative planographic printing plate precursor according to claim 1, wherein the aqueous alkali solution-soluble polymer comprises at least one kind of minimum constituent unit including at least one acidic group selected from a group consisting of a phenolic hydroxyl group, sulfonamide group, substituted sulfonamide-based acidic group, carboxylic acid group, sulfonic acid group, and phosphoric acid group.

5. The negative planographic printing plate precursor according to claim 4, wherein the acidic group has a pKa of no more than 14 and the acidic group is contained in the aqueous alkali solution-soluble polymer in an amount of 0.1 to 12 milliequivalents based on 1 gram of the aqueous alkali solution-soluble polymer.

6. The negative planographic printing plate precursor according to claim 1, wherein the aqueous alkali solution-soluble polymer is a copolymer copolymerized from a compound including at least one acidic group selected from the group consisting of a phenolic hydroxyl group, sulfonamide group, substituted sulfonamide-based acidic group, carboxylic acid group, sulfonic acid group, and phosphoric acid group, and the copolymer is copolymerized with the compound being present in an amount of 10 mol % or more.

7. The negative planographic printing plate precursor according to claim 1, wherein the aqueous alkali solution-soluble polymer has a weight-average molecular weight of 5,000 to 300,000, a number-average molecular weight of 800 to 250,000 and a dispersion degree of from 1.1 to 10.

8. The negative planographic printing plate precursor according to claim 1, wherein the overcoat layer comprises 30 to 99% by weight of the aqueous alkali solution-soluble polymer.

9. The negative planographic printing plate precursor according to claim 1, wherein the onium salt is at least one onium salt selected from a group consisting of an iodonium salt, diazonium salt, and sulfonium salt, and has a maximum absorption of 400 nm or less.

10. The negative planographic printing plate precursor according to claim 1, wherein the light-to-heat conversion agent is an infrared ray absorbing agent having maximum absorption at a wavelength of from 760 nm to 1200 nm.

11. The negative planographic printing plate precursor according to claim 1, comprising a cyanine dye represented by general formula (I) as the light-heat conversion agent:

General formula (I)

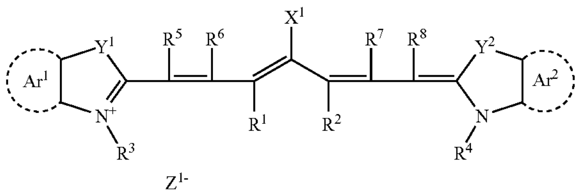

wherein, $X^1$ represents one of a halogen atom, $X^2$-$L^1$ and $NL^2L^3$; $X^2$ represents one of an oxygen atom and a sulfur atom; $L^1$ represents a hydrocarbon group having from 1 to 12 carbon atoms; $L^2$ and $L^3$ each independently represents a hydrocarbon group having from 1 to 12 carbon atoms; and $R^1$ and $R^2$ each independently represents a hydrocarbon group having from 1 to 12 carbon atoms; $Ar^1$ and $Ar^2$ each independently represents an aromatic hydrocarbon group which may have a substituent; $Y^1$ and $Y^2$ each independently represents a sulfur atom or dialkylmethylene group having from 1 to 12 carbon atoms; $R^3$ and $R^4$ each independently represents a hydrocarbon group which may have a substituent and have from 1 to 20 carbon atoms; $R^5$, $R^6$, $R^7$ and $R^8$ each independently represents a hydrogen atom or a hydrocarbon group having from 1 to 12 carbon atoms; and $Z^{1-}$ represents a counter anion.

12. The negative planographic printing plate precursor according to claim 1, wherein a substrate is selected from a polyester film and an aluminum plate.

13. The negative planographic printing plate precursor according to claim 1, comprising at least one layer selected from a group consisting of an undercoat layer, an intermediate layer, and a backcoat layer.

14. The negative planographic printing plate precursor according to claim 1, wherein the onium salt is a sulfonium salt.

15. A negative planographic printing plate precursor which is capable of directly making a printing plate using an infrared laser comprising:

a substrate;

a photosensitive layer disposed on the substrate, the photosensitive layer including a light-to-heat conversion agent and a compound which is at least one of crosslinkable and polymerizable, with solubility of the photosensitive layer in an alkali developing solution being decreased by the effect of at least one of light and heat; and an overcoat layer including a polymer, which is hydrophobic and soluble in an aqueous alkali solution and which does not have sensitivity to an infrared laser, wherein the substrate, photosensitive layer and overcoat layer are provided in that order;

the photosensitive layer is an acid crosslinking layer comprising: a compound, which generates acid by being exposed by at least one of light and heat;

a crosslinking compound, which crosslinks by the generated acid; and an alkali-soluble polymer, which reacts with the crosslinking agent in the presence of an acid; and the compound which generates acid by at least one of being irradiated with light having a wavelength of 200 to 500 nm and by being heated at least 100° C.

16. The negative planographic printing plate precursor according to claim 15, wherein the overcoat layer is formed on the photosensitive layer.

17. The negative planographic printing plate precursor according to claim 15, wherein the hydrophobicity is expressed by a contact angle with water of at least 50 degrees.

18. The negative planographic printing plate precursor according to claim 15, wherein the aqueous alkali solution-soluble polymer comprises at least one kind of minimum constituent unit including at least one acidic group selected from a group consisting of a phenolic hydroxyl group, sulfonamide group, substituted sulfonamide-based acidic group, carboxylic acid group, sulfonic acid group, and phosphoric acid group.

19. The negative planographic printing plate precursor according to claim 18, wherein the acidic group has a pKa of no more than 14 and the acidic group is contained in the aqueous alkali solution-soluble polymer in an amount of 0.1 to 12 milliequivalents based on 1 gram of the aqueous alkali solution-soluble polymer.

20. The negative planographic printing plate precursor according to claim 15, wherein the aqueous alkali solution-soluble polymer is a copolymer copolymerized from a compound including at least one acidic group selected from the group consisting of a phenolic hydroxyl group, sulfonamide group, substituted sulfonamide-based acidic group, carboxylic acid group, sulfonic acid group, and phosphoric acid group, and the copolymer is copolymerized with the compound being present in an amount of 10 mol % or more.

21. The negative planographic printing plate precursor according to claim 15, wherein the aqueous alkali solution-soluble polymer has a weight-average molecular weight of 5,000 to 300,000, a number-average molecular weight of 800 to 250,000 and a dispersion degree of from 1.1 to 10.

22. The negative planographic printing plate precursor according to claim 15, wherein the overcoat layer comprises 30 to 99% by weight of the aqueous alkali solution-soluble polymer.

23. The negative planographic printing plate precursor according to claim 15, wherein the light-to-heat conversion agent is an infrared ray absorbing agent having maximum absorption at a wavelength of from 760 nm to 1200 nm.

24. The negative planographic printing plate precursor according to claim 15, comprising a cyanine dye represented by general formula (I) as the light-heat conversion agent:

General formula (I)

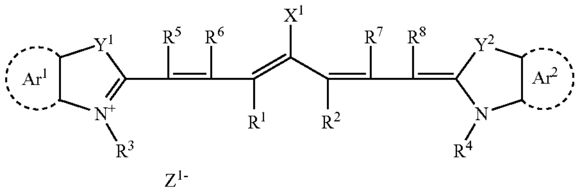

wherein $X^1$ represents one of a halogen atom, $X^2$-$L^1$ and $NL^2L^3$; $X^2$ represents one of an oxygen atom and a sulfur atom; $L^1$ represents a hydrocarbon group having from 1 to 12 carbon atoms; $L^2$ and $L^3$ each independently represents a hydrocarbon group having from 1 to 12 carbon atoms; $R^1$ and $R^2$each independently represents a hydrocarbon group having from 1 to 12 carbon atoms; $Ar^1$ and $Ar^2$ each independently represents an aromatic hydrocarbon group which may have a substituent; $Y^1$ and $Y^2$ each independently represents a sulfur atom or a dialkylmethylene group having from 1 to 12 carbon atoms; $R^3$ and $R^4$ each independently represents a hydrocarbon group which may have a substituent and have from 1 to 20 carbon atoms; $R^5$, $R^6$, $R^7$ and $R^8$ each independently represents a hydrogen atom or a hydrocarbon group having from 1 to 12 carbon atoms; and $Z^{1-}$ represents a counter anion.

25. The negative planographic printing plate precursor according to claim 15, wherein a substrate is selected from a polyester film and an aluminum plate.

26. The negative planographic printing plate precursor according to claim 15, comprising at least one layer selected from a group consisting of an undercoat layer, an intermediate layer, and a backcoat layer.

27. A planographic printing plate precursor comprising:

a substrate;

a photosensitive layer disposed on the substrate, the photosensitive layer including a light-to-heat conversion agent and a compound, which is at least one of crosslinkable and polymerizable, with solubility of the photosensitive layer in an alkali developing solution being decreased by the effect of at least one of light and heat; and an overcoat layer including a polymer, which is hydrophobic and soluble in an aqueous alkali solution, wherein the substrate, photosensitive layer and overcoat layer are provided in that order;

the photosensitive layer is an acid crosslinking layer comprising: a compound, which generates acid by being exposed by at least one of light and heat; a crosslinking compound, which crosslinks by the generated acid; and an alkali-soluble polymer, which reacts with the crosslinking agent in the presence of an acid; and the crosslinking compound is at least one crosslinking compound selected from a group consisting of: aromatic compounds substituted with at least one of hydroxymethyl group and alkoxymethyl group; compounds comprising at least one of N-hydroxymethyl group, N-alkoxymethyl group, and N-acyloxymethyl group: and, epoxy compounds.

28. The planographic printing plate precursor according to claim 27, wherein the overcoat layer is formed on the photosensitive layer.

29. The planographic printing plate precursor according to claim 27, wherein the overcoat layer does not have sensitivity to an infrared laser.

30. The planographic printing plate precursor according to claim 27, wherein the hydrophobicity is expressed by a contact angle with water of at least 50 degrees.

31. The planographic printing plate precursor according to claim 27, wherein the aqueous alkali solution-soluble polymer comprises at least one kind of minimum constituent unit including at least one acidic group selected from a group consisting of a phenolic hydroxyl group, sulfonamide group, substituted sulfonamide-based acidic group, carboxylic acid group, sulfonic acid group, and phosphoric acid group.

32. The planographic printing plate precursor according to claim 31, wherein the acidic group has a pKa of no more than 14 and the acidic group is contained in the aqueous alkali solution-soluble polymer in an amount of 0.1 to 12 milliequivalents based on 1 gram of the aqueous alkali solution-soluble polymer.

33. The planographic printing plate precursor according to claim 27, wherein the aqueous alkali solution-soluble polymer has a weight-average molecular weight of 5,000 to 300,000, a number-average molecular weight of 800 to 250,000 and a dispersion degree of from 1.1 to 10.

34. The planographic printing plate precursor according to claim 27, wherein the overcoat layer comprises 30 to 99% by weight of the aqueous alkali solution-soluble polymer.

35. The planographic printing plate precursor according to claim 27, wherein the light-to-heat conversion agent is an infrared ray absorbing agent having maximum absorption at a wavelength of from 760 nm to 1200 nm.

36. The planographic printing plate precursor according to claim 27, comprising a cyanine dye represented by general formula (1) as the light-heat conversion agent:

General formula (I)

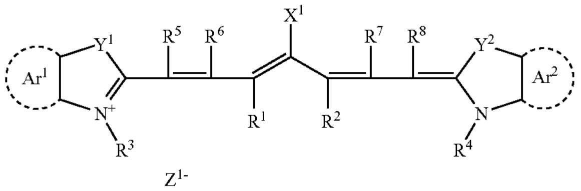

wherein $X^1$ represents one of a halogen atom, $X^2$-$L^1$ and $NL^2L^3$; $X^2$ represents one of an oxygen atom and a sulfur atom; $L^1$ represents a hydrocarbon group having from 1 to 12 carbon atoms; $L^2$ and $L^3$ each independently represents a hydrocarbon group having from 1 to 12 carbon atoms; $R^1$ and $R^2$ each independently represents a hydrocarbon group having from 1 to 12 carbon atoms; $Ar^1$ and $Ar^2$ each independently represents an aromatic hydrocarbon group which may have a substituent; $Y^1$ and $Y^2$ each independently represents a sulfur atom or a dialkylmethylene group having from 1 to 12 carbon atoms; $R^3$ $R^4$ each independently represents a hydrocarbon group which may have a substituent and have from 1 to 20 carbon atoms; $R^5$, $R^6$, $R^7$ and $R^8$ each independently represents a hydrogen atom or a hydrocarbon group having from 1 to 12 carbon atoms; and $Z^{1-}$ represents a counter anion.

37. The planographic printing plate precursor according to claim 27, wherein a substrate is selected from a polyester film and an aluminum plate.

38. The planographic printing plate precursor according to claim 27, comprising at least one layer selected from a group consisting of an undercoat layer, an intermediate layer, and a backcoat layer.

39. The planographic printing plate precursor according to claim 27, wherein the aqueous alkali solution-soluble polymer is a copolymer copolymerized from a compound including at least one acidic group selected from the group consisting of a phenolic hydroxyl group, sulfonamide group, substituted sulfonamide-based acidic group, carboxylic acid group, sulfonic acid group, and phosphoric acid group, and the copolymer is copolymerized with the compound being present in an amount of 10 mol % or more.

* * * * *